(12) United States Patent
Sogawa et al.

(10) Patent No.: US 7,795,585 B2
(45) Date of Patent: Sep. 14, 2010

(54) VACUUM PACKAGE AND MANUFACTURING PROCESS THEREOF

(75) Inventors: Yoshimichi Sogawa, Tokyo (JP); Takao Yamazaki, Tokyo (JP); Masahiko Sano, Tokyo (JP); Seiji Kurashina, Tokyo (JP); Yuji Akimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 27 days.

(21) Appl. No.: 12/324,424

(22) Filed: Nov. 26, 2008

(65) Prior Publication Data

US 2009/0140146 A1 Jun. 4, 2009

(30) Foreign Application Priority Data

Nov. 30, 2007 (JP) .............................. 2007-310694

(51) Int. Cl.
*G01J 5/00* (2006.01)

(52) U.S. Cl. ............... 250/338.1; 250/340; 250/370.01; 257/794; 257/779; 438/15

(58) Field of Classification Search ............. 250/338.1, 250/433, 370.01, 340; 257/794, 779; 435/15
See application file for complete search history.

(56) References Cited

U.S. PATENT DOCUMENTS

| | | | | |
|---|---|---|---|---|
| 5,914,488 A | * | 6/1999 | Sone | 250/338.1 |
| 6,753,526 B2 | * | 6/2004 | Vilain | 250/338.1 |

2007/0096311 A1 5/2007 Humpston et al.

FOREIGN PATENT DOCUMENTS

| | | |
|---|---|---|
| EP | 1 640 333 A1 | 3/2006 |
| EP | 1 775 766 A1 | 4/2007 |
| JP | 52-32269 | 3/1977 |
| JP | P11-326037 A | 11/1999 |
| JP | 11-351876 | 12/1999 |
| JP | P11-340348 A | 12/1999 |
| JP | 2003-86722 | 3/2003 |
| JP | P2004-266763 A | 9/2004 |
| JP | 2004-289238 | 10/2004 |
| JP | 2008-91417 | 4/2008 |
| WO | WO 2006/129354 A1 | 12/2006 |

OTHER PUBLICATIONS

English abstract only of JP 11-326037, Nov. 26, 1999.
Japanese Office Action dated Nov. 10, 2009 together with English translation.

* cited by examiner

*Primary Examiner*—David P Porta
*Assistant Examiner*—Jessica L Eley
(74) *Attorney, Agent, or Firm*—Scully, Scott, Murphy & Presser, P.C.

(57) ABSTRACT

A vacuum package has a chamber in which pressure is reduced to less than the atmospheric pressure, a functional component sealed in the chamber, and a material forming at least a part of the chamber. The material has at least one through hole to evacuate the chamber. In a cross section perpendicular to the material taken along the through hole, an edge portion of the material forming the through hole has an obtuse angle. The through hole is sealed with a sealing material.

10 Claims, 17 Drawing Sheets

FIG.19
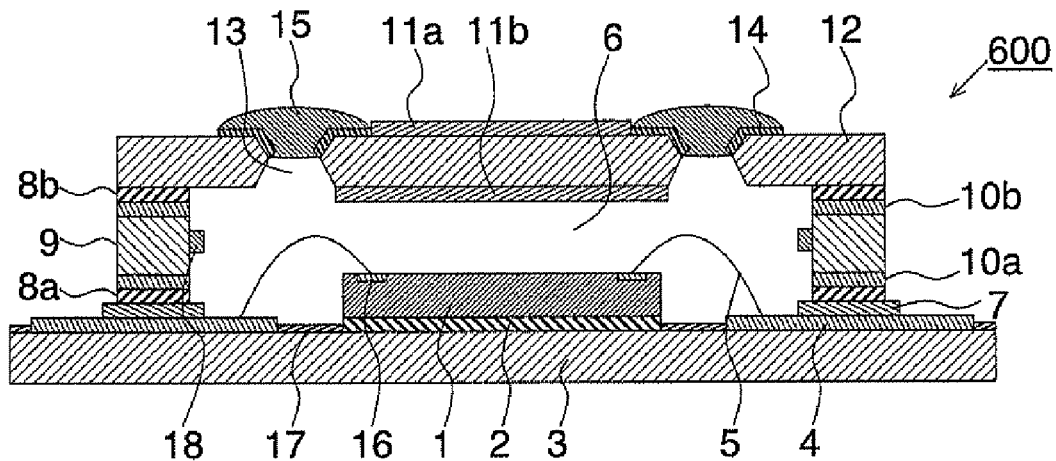
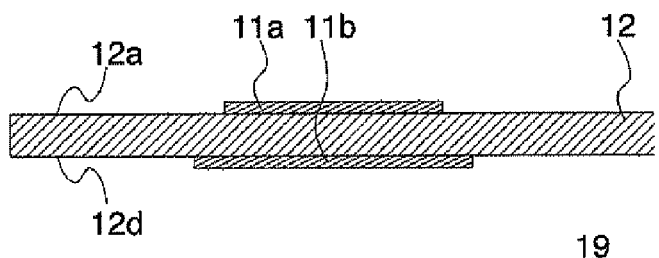
FIG.20A
FIG.20B
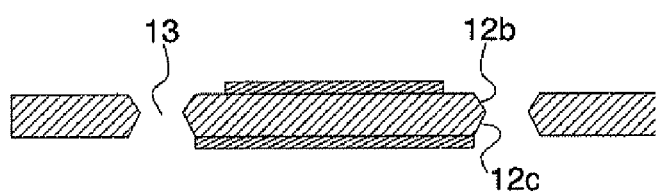
FIG.20C
FIG.20D
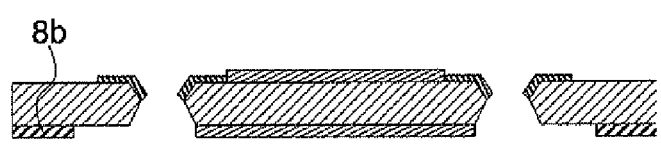
FIG.20E

VACUUM PACKAGE AND MANUFACTURING PROCESS THEREOF

REFERENCE TO RELATED APPLICATION

This application is based upon and claims the benefit of the priority of Japanese patent application No. 2007-310694, filed on Nov. 30, 2007, the disclosure of which is incorporated herein in its entirety by reference thereto.

TECHNICAL FIELD

This invention relates to a package vacuum-sealing a functional component (an infrared detecting component, a piezoelectric component, and an oscillating component, for example) termed "vacuum package" herein, and manufacturing process thereof.

BACKGROUND

In a functional device such as an infrared sensor, a pressure sensor, and an acceleration sensor, it is necessary to vacuum-seal each functional component in order to enhance its performance.

Giving an example of the infrared sensor, there are a quantum type and a heat type as an infrared detecting component generally, the heat type being a type of detecting relative quantity of heat. Although a following performance of the heat type is inferior to that of the quantum type, the heat type can be of a non-cooling type and therefore capable of suppressing a manufacturing cost owing to simplification of the design. In the infrared sensor of the heat type, infrared rays traveling through a window are absorbed into a receiving portion of a detecting component, and a resistance change resulting from a temperature change which is followed by the absorption is detected as a signal. Therefore, in the infrared sensor used in a surveillance camera for night security and a thermography which displays calculated temperature distribution, it is necessary to thermally isolate the receiving portion to detect the signal sensitively. The thermal isolation can be achieved by floating the receiving portion in midair or disposing the infrared detecting component itself in a vacuum case, for example.

In FIG. 24, a schematically cross-sectional view is illustrated to explain a vacuum package for infrared detection disclosed in Patent Document 1. In the vacuum package for infrared detection disclosed in Patent Document 1, a substrate 901 on which a receiving portion 902 is formed and an infrared transmission window 904 in which one or more through hole/holes 911 is/are provided and which is disposed above the front surface of the receiving portion 902 on the substrate 901 via a gap 903 are formed, the transmission window 904 being fixed on the substrate 901 by airtight adhesion at an adhesive surface surrounding the receiving portion 902 wholly, the gap 903 between the substrate 901 and the transmission window 904 being evacuated by exhaustion through the through hole 911, the through hole 911 of the transmission window 904 being sealed by a sealing material 912 airtightly.

In addition, the sealing technology for the vacuum package sealing the functional component is disclosed in Patent Documents 2 and 3, for example.

In a package for a piezoelectric device disclosed in Patent Document 2, a frame substrate is put on a bottom substrate to form an inner space for accommodating a piezoelectric oscillating piece on the inside of the frame substrate, a through hole being formed in the bottom substrate, connecting the inner space with an outer space and being sealed by a fused sealing material, the bottom substrate being formed of one layer of a substrate, the through hole having an inner circumference larger than the external shape of the sealing material before fusing and having an inner circumference smaller than the external shape of the sealing material before fusing on the inner side of the larger inner circumference. A metal coat portion having a good wetting property to the sealing material is formed on the inner circumference surface of the through hole.

In FIG. 25, a schematically cross-sectional view is illustrated to explain a sealing package design for a component disclosed in Patent Document 3. In FIG. 26, a partial view of a hole portion illustrated in FIG. 25 is illustrated. The sealing package design for the component comprises a component forming substrate 922, a cover substrate 923 connected on the component forming substrate 922, a component 921 accommodated in a space 925 surrounded by the component forming substrate 922 and cover substrate 923, a hole portion 926 from an opening portion on a surface of the cover substrate 923 to a surface of the component forming substrate 922, a through hole 929 having a smaller diameter opening portion 930a smaller than the hole portion 926 in a surface region of the component forming substrate 922 surrounded by the hole portion 926 and leading to the space 925 through the smaller diameter opening portion 930a, a sealing material 931 sealing the accommodating space of the component 921 by closing the smaller diameter opening portion 930a of the through hole 929, a sealing connection reinforcement film 933 enhancing connection strength of the sealing material 931 formed on the smaller opening portion upper edge 930b of the through hole 929. A neck portion 932 which makes it narrower the diameter between the opening portion and the surface of the component forming substrate 922 is formed in the hole portion 926. In the sealing package design, the sealing package design for the component in which the space 925 is not sealed yet is disposed in a vacuum device, the space 925 being evacuated by exhausting air through the through hole 929 and the hole portion 926, gas in the sealing material 931 being removed when the sealing material 931 on the neck portion 932 is fused by applying heat during the evacuation, the smaller diameter opening portion 930a of the through hole 929 being sealed with the sealing material 931 by falling the fused sealing material 931 from the neck portion 932 to the smaller diameter opening portion 930a of the through hole 929, the space 925 for accommodating the component 921 being sealed.

[Patent Document 1]
  JP Patent Kokai Publication No. JP-P11-326037A

[Patent Document 2]
  JP Patent Kokai Publication No. JP-P2004-266763A

[Patent Document 3]
  JP Patent Kokai Publication No. JP-P11-340348A

SUMMARY OF THE DISCLOSURE

The entire disclosures of Patent Documents 1, 2 and 3 are incorporated herein by reference thereto.

In FIGS. 27A-29, schematically cross-sectional views of a through hole are illustrated to explain problems to be solved by the present invention. FIGS. 27A and 28A illustrate a state before sealing in which a sealing material is placed on the through hole. FIGS. 27B and 28B illustrate a state after sealing in which the sealing material is molten.

In the sealing technology as disclosed in Patent Document 1, the sealing material such as solder does not seal an inside of the through hole (between inner walls), but seals the opening of the through hole. In this case, as shown in FIG. 27A, for example, a pad (metal coating) 942 for the sealing material is formed around the opening of the through hole 943, the sealing material (a solder ball, for example) 944 being put on the through hole 943, the sealing material 944 being molten. In this mode, however, the sealing material 944 flows so as to avoid the opening of the through hole 943 as shown in FIG. 27B or falls down through the through hole 943, so that there arises a problem that the through hole 943 can not be sealed completely. If the diameter of the opening of the through hole 943 is wide, a defect of the sealing tends to arise especially.

In the sealing technology as disclosed in Patent Document 2, the inside of the through hole is sealed with the sealing material completely. In this case, as shown in FIG. 28, for example, a pad (metal coating) 952 for the sealing material is formed on the whole inner wall of a through hole 953. In this mode, however, as shown in FIG. 28B, the sealing material 954 often projects from the through hole 953 owing to its surface tension. In the package design made thinner, because the distance between the through hole 953 and the functional component (infrared receiving component, for example) is short, the projected sealing material 954a reaches the functional component or metal wiring (wire bonding, for example), and therefore a fault of the function (a fault of picturing, for example) or a short circuit arises. If lead-free solder is used as the sealing material 954, especially, because a needle whisker of Sn tends to grow, a risk of the short circuit caused by the whisker which grows as time passes becomes higher even if the solder is not in direct contact with the wire in an initial stage. Accordingly, in the formulation as shown in FIG. 28, it is necessary to secure enough distance between the sealing material 954 and the functional component or metal wiring. In this case, however, the package can not be made thinner.

In the sealing technology as disclosed in Patent Document 3, the inside of the through hole (between the inner walls) can not be sealed by the sealing material, because the sealing material falls from the neck portion in the end. Accordingly, the sealing technology as disclosed in Patent Document 3 can not be applied to the through hole of the package in the formulation as shown in FIG. 24.

If the through hole having a taper as shown in FIGS. 27A-29 is formed, a part which has an angle of 90 degree or less is formed in the substrate in which the through hole is formed (edge portions 945, 955 in FIGS. 27A-29, for example). The edge portion having the right angle or cute angle has a risk that a break arises by heat stress caused by swelling and contraction of the sealing material in the time of sealing or using the product. Because a material, such as silicon and germanium, which is often used for the infrared transmission window, light-receiving component substrate, spacer and the like is easy to break highly, the risk of the sealing defect caused by a crack especially becomes higher if the through hole having the acute angle part is formed in the material.

In the infrared sensor, an ordinary infrared transmission window has a thickness of about 0.5 mm to 1.0 mm. If the through hole 943 having the taper as shown in FIGS. 27 and 29, for example, is formed in the infrared transmission window having such thickness, it is necessary to make the through hole 943 having a relatively large size to the volume of the package for enough conductance in order to be evacuated through the through hole 943. In other words, it is necessary to form the through hole 943 so that a minimum area S1 of a first opening 941a formed on one surface is large enough because the evacuation depends on a minimum area of the through hole 943. However, if the minimum are S1 is made larger, the maximum area S2 of a second opening 941b formed on the other surface also automatically becomes larger owing to the taper shape of the through hole 943. As a result, there arises a problem that the size of the package also becomes greater automatically.

Next, a method of calculating the conductance of the through hole will be explained. A simple vacuum package as shown in FIG. 30, for example, is supposed as one model, in which a through hole having the diameter D and length L is connected to a box having dimensions X×Y×Z. If the mean free path of a gas molecule is expressed in a term of λ, a pressure region which meets with λ<<D is regarded as a viscous flow region, and it is known that its conductance depends on pressure. Conductance Cp in the viscous flow region is expressed by formula 1 if the mean pressure from both sides of the through hole is expressed in a term of p. Gas charged in the package is assumed to be air having temperature of 20 degrees C. A unit of p is Torr, and a unit of L and D is cm.

$$Cp=182\times(D^4/L)\times p(1/s) \quad \text{[Formula 1]}$$

On the other hand, a pressure region which meets with λ>>D is regarded as a molecular flow region, and conductance Ck in the molecular flow region is expressed by formula 2. In this case, gas charged in the package is also assumed to be air having temperature of 20 degrees C. A unit of L and D is cm.

$$Ck=12.1\times(D^3/L)(1/s) \quad \text{[Formula 2]}$$

The mean free path λ is expressed by formula 3 which is an approximate formula if the air has room temperature and pressure of p.

$$\lambda(mm)\approx 5\times 10^{-2}/p \quad \text{[Formula 3]}$$

If formula 3 is used and diameter D of the through hole is assumed to be 0.1 mm, it is calculated that pressure p is about 50 Torr or more in the viscous flow region of λ/D lower than about 0.01, and that pressure p is about 0.05 Torr or below in the molecule flow region of λ/D higher than about 10. In a region of pressure p of 0.05 Torr to 50 Torr (6.67 Pa to 6665 Pa), λ/D is a middle region of higher than 0.01 and lower than 10. It is necessary to secure enough conductance until the molecule flow region because the degree of vacuum for the vacuum sealing package such as the infrared sensor is usually $10^{-2}$ Torr to $10^{-6}$ Torr ($133.3\times 10^{u-2}$ to $133.3\times 10^{-6}$ Pa).

If conductance Cp of the viscous flow region in the through hole having D of 0.1 mm and L of 1 mm is calculated from formula 1, the value is 18×P (mm³/s), and conductance Ck calculated from formula 2 is 121 (mm³/s). If the measures of the vacuum package are 14 mm×14 mm×1.4 mm and the volume is 274 mm³, the evacuation is assumed to be applicable even if the conductance of the molecule flow region is considered.

However, the result is obtained when the diameter of the through hole is assumed to be 0.1 mm. If the diameter of the through hole is made smaller than 0.1 mm, high vacuum package can not be achieved because conductance Ck falls in proportion to the diameter of the through hole to the power of three. In other words, in order to achieve the high vacuum package in the infrared sensor, for example, although it is necessary to make the diameter of the first opening 941a in FIG. 29 at least 0.1 mm, the diameter of the second opening 941b also becomes larger than 0.1 mm automatically. Conversely, if the maximum area S2 of the second opening 941b is made smaller than that area, the minimum area S1 of the first opening 941a is too small to be evacuated sufficiently. In other words, in order to achieve the high vacuum and small package, it is necessary to form the through hole having a small opening area and sufficiently large conductance.

It is an object of the present invention to provide a vacuum package to achieve high vacuum without becoming larger and entailing sealing defect and functional fault, and to provide a manufacturing process thereof.

According to a first aspect of the present invention, there is provided a vacuum package comprising a chamber in which pressure is reduced to less than the atmospheric pressure, a functional component sealed in the chamber, and a material forming at least a part of the chamber. The material has at least one through hole to evacuate the chamber. In a cross section perpendicular to the material taken along the through hole, an edge portion of the material forming the through hole has an obtuse angle. The through hole is sealed with a sealing material.

According to a preferred mode in the first aspect, an inner wall of the through hole has a first taper surface which reduces an opening area of the through hole in a direction from an outer surface side toward an inner surface side of the chamber and a second taper surface which reduces the opening area of the through hole in the direction from the inner surface side toward the outer surface side of the chamber. The first taper surface is formed on the outer surface side as compared with the second taper surface.

According to a preferred mode in the first aspect, the vacuum package has a pad formed on only the first taper surface in the inner wall of the through hole. The pad has a higher wetting property to the sealing material than the material.

According to a preferred mode in the first aspect, the first taper surface and the second taper surface are formed continuously.

According to a preferred mode in the first aspect, the sealing material does not project from the through hole into the chamber.

According to a preferred mode in the first aspect, the functional component is an infrared receiving component. The chamber comprises, at least, a light-receiving component substrate on which the infrared receiving component is mounted, an infrared transmission window transmitting infrared rays so that the infrared receiving component receives the infrared rays from the outside of the chamber, and a spacer forming a predetermined gap between the light-receiving component substrate and the infrared transmission window. The material forming the through hole is at least one of the light-receiving component substrate, the infrared transmission window and the spacer.

According to a second aspect of the present invention, there is provided a process of manufacturing a vacuum package in which a functional component is sealed in a chamber, pressure in the chamber being reduced to less than the atmospheric pressure. The process has forming a through hole to evacuate the chamber in a material forming at least a part of the chamber (termed herein as "through hole forming step"), an inner wall of the through hole having at least a tubular first taper surface and a tubular second taper surface, the first taper surface being formed from one surface of the material so as to reduce an opening area, the second taper surface being formed from the other surface of the material so as to reduce an opening area, evacuating the chamber (termed herein as "evacuating step") accommodating the functional component from (through) the through hole, and sealing the through hole with a sealing material. In the through hole forming step, the through hole is formed so that an edge portion of the material forming the through hole has an obtuse angle in a cross section perpendicular to the material taken along the through hole.

According to a preferred mode in the second aspect, the process further has, after the through hole forming step, forming a pad on the first taper surface located on the outer side of the chamber as compared with the second taper surface. The pad has a higher wetting property to the sealing material than the material. The sealing material placed on the pad of the first taper surface or on the opening of the through hole formed on the one surface of the material is fused to seal the through hole.

According to a preferred mode in the second aspect, in the evacuating step, before the chamber is evacuated, the sealing material is placed on the pad of the first taper surface or on the opening of the through hole formed on the one surface of the material. The chamber is evacuated through a gap between the sealing material and the through hole. After evacuating the chamber, the sealing material is fused to seal the through hole.

According to a preferred mode in the second aspect, in the sealing step, after the chamber is evacuated, the sealing material is placed on the pad of the first taper surface or on the opening of the through hole formed on the one surface of the material. The sealing material is fused to seal the through hole.

The meritorious effects of the present invention are summarized as follows.

According to the present invention, a through hole having large conductance can be formed without need of a large opening area, because a neck portion having a minimum opening area is formed in the middle of the through hole. Accordingly, the vacuum package can be downsized, and high evacuation and short-time evacuation of (interior of) the vacuum package can be achieved.

According to the present invention, occurrence of a crack in an edge portion of the through hole can be suppressed even if a fragile material is used because the edge portion of the through hole has an obtuse angle. Accordingly, the airtightness (belmetic sealing property) of the vacuum package can be enhanced.

According to the present invention, the sealing material or whisker is prevented from entering into a chamber by forming a pad for a sealing material on only a first taper surface in the inner wall of the through hole. Accordingly, a functional fault or electrical short circuit can be prevented. The through hole can be also sealed at a part having the minimum opening area. Therefore, occurrence of a sealing defect can be prevented.

BRIEF DESCRIPTION OF THE DRAWINGS

FIG. 19 is a schematically cross-sectional view of a vacuum package according to a twelfth exemplary embodiment of the present invention.

FIGS. 20A-20E are a schematic process flow according to a thirteenth exemplary embodiment of the present invention to explain a process of forming a through hole in a vacuum package of the present invention.

PREFERRED MODES OF THE INVENTION

A vacuum package of the present invention will be explained below giving an example of a vacuum package of an infrared sensor in which an infrared receiving component is vacuum-sealed as a functional component.

Figure 1:
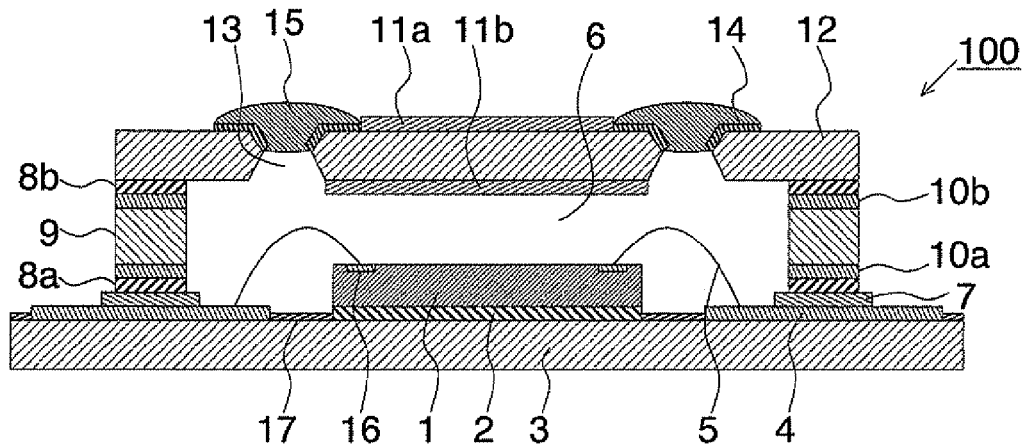
FIG. 1 is a schematically cross-sectional view of a vacuum package according to a first exemplary embodiment of the present invention.

A vacuum package according to a first exemplary embodiment of the present invention will be explained. In FIG. 1, a schematically cross-sectional view of the vacuum package according to the first exemplary embodiment of the present invention is illustrated. A vacuum package 100 comprises an infrared receiving component 1 detecting infrared rays, a light-receiving component substrate 3 mounting on the infrared receiving component 1, an infrared transmission window 12 transmitting the infrared rays so as to receive the light by the infrared receiving component 1, and a spacer 9 defining a predetermined distance between the light-receiving component substrate 3 and the infrared transmission window 12. The infrared receiving component 1 is fixed on the light-receiving component substrate 3 by a bonding material 2, and a chamber 6 accommodating the infrared receiving component 1 is formed on the infrared receiving component 1 by covering the side surface and top surface of the infrared receiving component 1 with the spacer 9 and infrared transmission window 12. The pressure in the chamber 6 is reduced to a pressure level of less than the atmospheric pressure and, preferably, less than $133.3 \times 10^{-2}$ to $133.3 \times 10^{-6}$ Pa.

Figure 2:
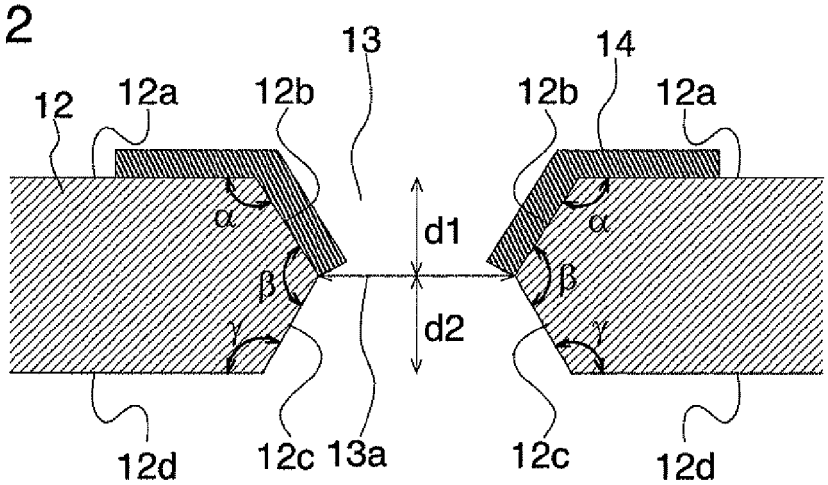
FIG. 2 is an enlarged and schematically cross-sectional view of a through hole in FIG. 1.
Figure 3:
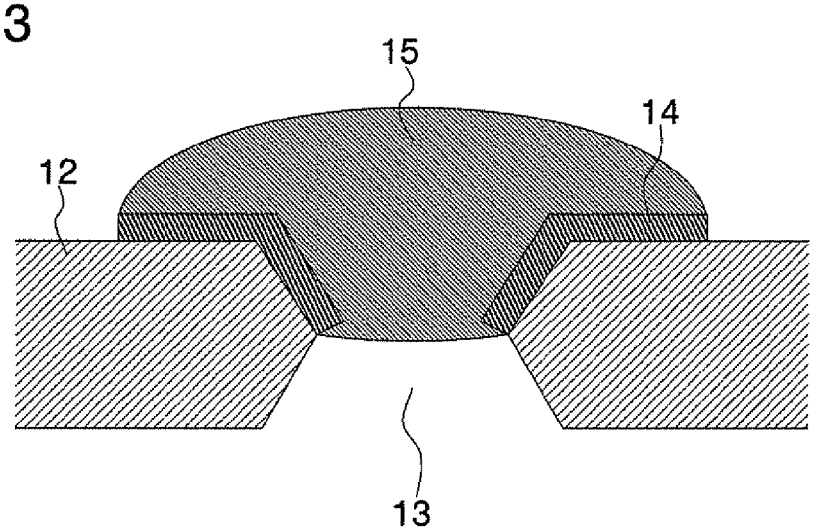
FIG. 3 is an enlarged and schematically cross-sectional view illustrating a state of a through hole sealed with a sealing material.

At least one through hole 13 to be used to evacuate the chamber 6 is formed in the infrared transmission window 12. In FIG. 2, an enlarged and schematically cross-sectional view of the through hole 13 is illustrated (an illustration of a sealing material 15 is omitted). In FIG. 3, an enlarged and schematically cross-sectional view showing a state after sealing the through hole 13 with the sealing material 15 is illustrated. The inner wall of through hole 13 has a first taper surface 12$b$ which reduces the opening area (width or diameter in the figure) from an outer surface 12$a$ facing to the outside of the chamber 6 to the inside of the chamber 6 and a second taper surface 12$c$ which reduces the opening area (width or diameter in the figure) from an inner surface 12$d$ facing to the inside of the chamber 6 toward the outside of the chamber 6. A neck portion 13$a$ which has the smallest opening area (width or diameter in the figure) of the through hole 13 is formed at the boundary between the first taper surface 12$b$ and the second taper surface 12$c$ by forming the first taper surface 12$b$ and the second taper surface 12$c$ continuously.

In the cross section perpendicular to the infrared transmission window 12 taken along (or including axis of) the through hole 13 (FIGS. 2 and 3), a first angle $\alpha$ of a first edge portion, which is formed by the outer surface 12$a$ and the first taper surface 12$b$, and a second angle $\beta$ of a second edge portion, which is formed by the first taper surface 12$b$ and the second taper surface 12$c$, are formed so as to have an obtuse angle because these edge portions are in contact with the sealing material 15 (via a sealing pad 14). Preferably, the first angle $\alpha$, the second angle $\beta$ and a third angle $\gamma$ of a third edge portion formed by the second taper surface 12$c$ and the inner surface 12$d$ are formed so as to have an obtuse angle. More preferably, the first angle $\alpha$, the second angle $\beta$ and the third angle s are designed to be 100° to 160°. Therefore, each of the first to third edge portions forming the through hole 13 in the infrared transmission material 12 has the obtuse angle, and thereby the occurrence of the defect in each edge portion can be suppressed.

The through hole 13 shown in FIGS. 1 and 2 has the first taper surface 12b and second taper surface 12c which are symmetrical to a center line (i.e. axis) passing through the through hole 13. In other words, the center line of the first taper surface 12b in the through hole 13 is consistent with the center line of the second taper surface 12c in the through hole 13. Therefore, a line defining the minimum width (minimum diameter) of the neck portion 13a extends parallel to the infrared transmission window 12 (the outer surface 12a or the inner surface 12d). The through hole 13 is excavated by the same depth from both sides of the infrared transmission window 12 so that the neck portion 13a is positioned preferably at the mid of a thickness of the infrared transmission window 12. In other words, a depth d1 of the first taper surface 12b formed from the outer surface 12a side is the same as a depth d2 of the second taper surface 12c formed from the inner surface 12d side.

The through hole 13 having the taper surfaces 12b and 12c may be formed by an etching process, for example. If an anisotropic etching process is used, the through holes having various taper shapes other than the configuration shown in FIGS. 1 and 2 may be formed. As an example of this exemplary embodiment, if Si is used as the infrared transmission window 12, for example, the outer surface 12a being a (100) surface, the infrared transmission window 12 being anisotropically etched from both sides of the infrared transmission window 12, a bisected angle β/2 of the second angle at the second edge portion may become 54.7° (namely, β=109.4°).

An opening shape of the through hole 13 (or a sectional shape along the surface of the infrared transmission window 12) on the surface of the infrared transmission window 12 (a plan view of the outer surface 12a or inner surface 12d) may be selected from various shapes (a circle, for example). It is preferred that the surface shape of the through hole 13 is designed so as to form a gap to evacuate the chamber 6 between the surface opening or inner wall of the through hole 13 and the sealing material 15 when the sealing material 15 before the sealing is put. When the shape of the sealing material 15 before sealing (fusion) is spherical, for example, if the opening shape of the through hole 13 is made the shape other than the circle, the chamber 6 can be evacuated via the gap between the through hole 13 and the sealing material 15 under the condition that the sealing material 15 is put on the through hole 13.

Figure 4:
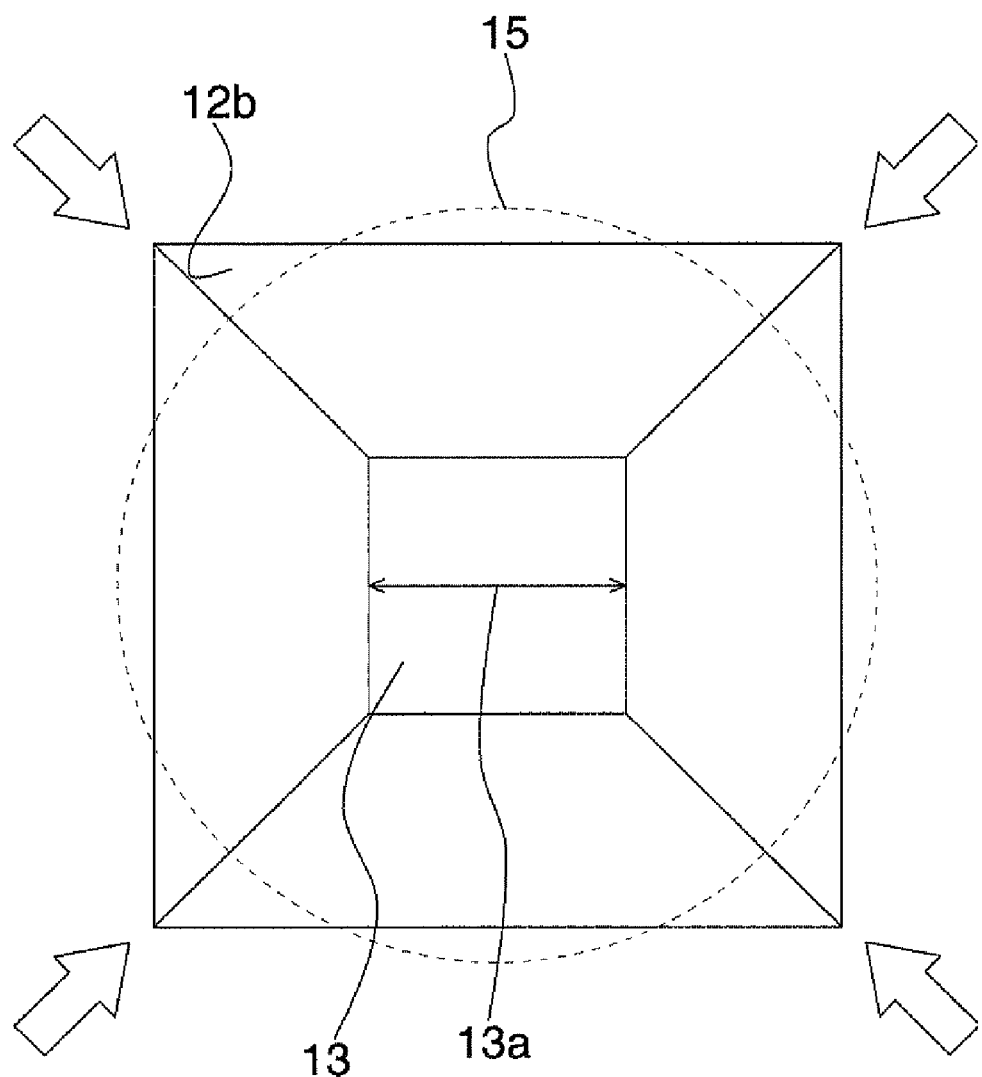
FIG. 4 is a schematic plan view illustrating an example of a surface shape of a through hole.

In FIG. 4, a schematic plan view showing one example of the surface shape of the through hole 13 is illustrated. The opening shape of the through hole 13 shown in FIG. 4 is a square. The through hole 13 has a shape which is formed by connecting smaller surfaces of two truncated pyramid together. If a spherical solder ball is used as the sealing material 15 (shown by a dotted line) in the time of sealing, the chamber 6 can be evacuated through the four corners (arrow portions) of the through hole 13 which are not closed with the solder ball 15 by putting the solder ball 15 on the through hole 13 before the evacuation of the chamber 6 and then evacuating the chamber 6.

Figure 5A:
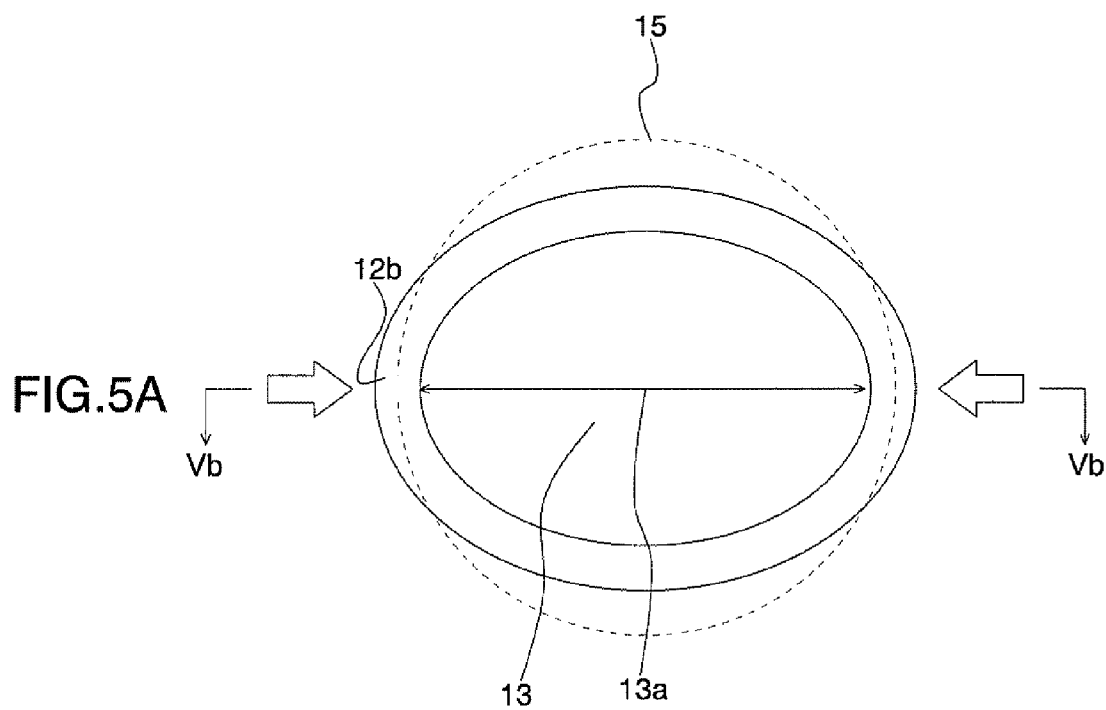
FIGS. 5A and 5B are a schematic plan view and a schematically cross-sectional view illustrating an example of a surface shape of a through hole.
Figure 5B:
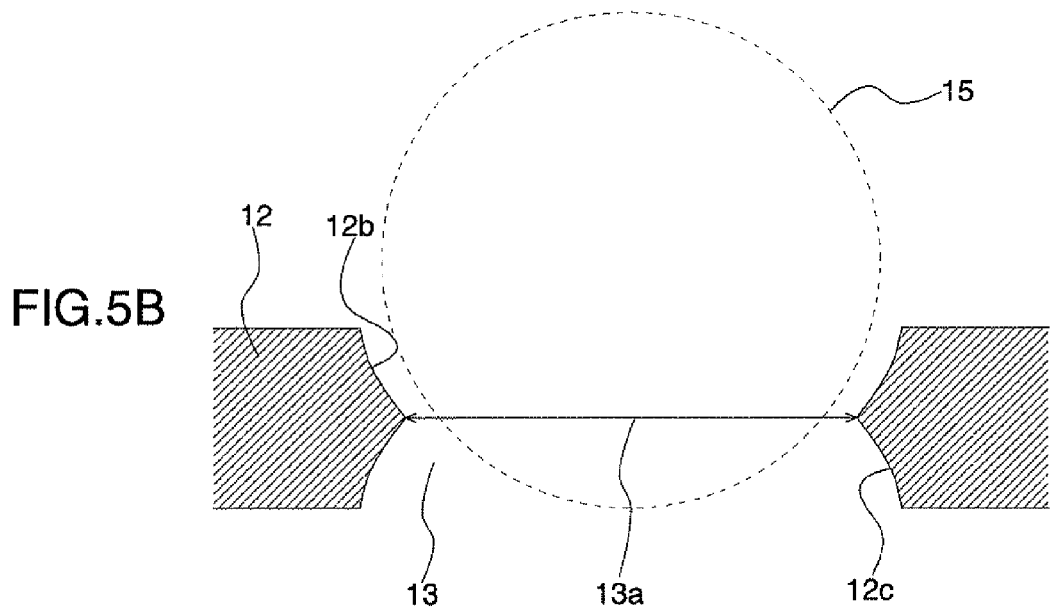
Figure 6A:
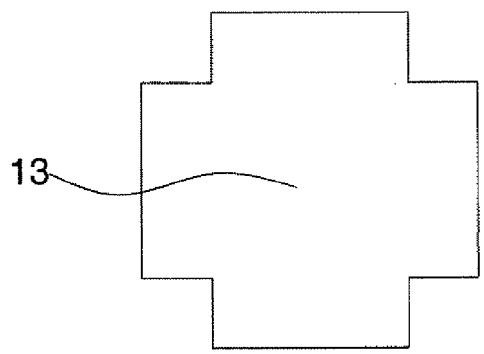
FIGS. 6A-6F is schematic plan views illustrating examples of a surface shape of a through hole.
Figure 6B:
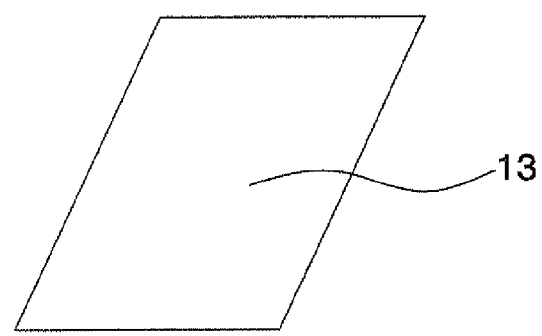
Figure 6C:
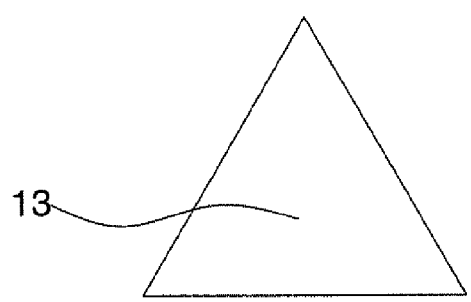
Figure 6D:
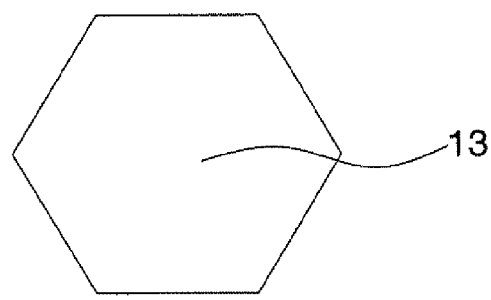
Figure 6E:
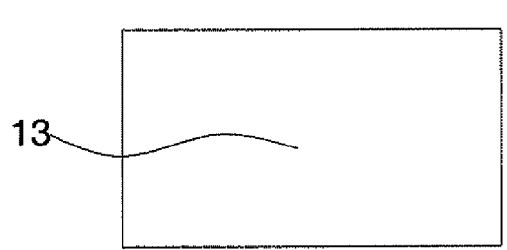
Figure 6F:
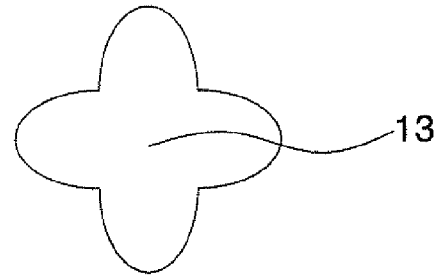

In FIGS. 5A and 5B, a schematic plan views and schematically cross-sectional view showing another example of the surface shape of the through hole 13 are illustrated. FIG. 5A is the schematic plan view showing one example of the surface shape of the through hole 13, and FIG. 5B is the schematically cross-sectional view taken along a line Vb-Vb line of FIG. 5A. The opening of the through hole 13 in FIG. 5 has an elliptical shape. Therefore, when the spherical solder ball (shown by a dotted line) as the sealing material 15 before sealing is put on the through hole 13, although the minor axis of the elliptical shape is closed with the solder ball 15, a gap to evacuate the chamber 6 is formed between both ends of the major axis (arrow portions) and the solder ball. As shown in FIG. 5B, the first taper surface 12b and second taper surface 12c may have a curved surface.

A projected plan shape of the through hole 13 is not limited to a circular, square and ellipse, and may be adopted from various shapes. As shown in FIGS. 6A to 6F, a cross shape (FIG. 6A), parallelogram (FIG. 6B), triangle (FIG. 6C), polygon (such as a hexagon) (FIG. 6D), rectangle (FIG. 6E), floral shape (FIG. 6F) and the like may be applied, for example.

As a process of forming the through hole 13 in the present invention, an anisotropic etching, isotropic etching, dry etching, drilling, sandblast, ultrasonic process, wire discharging, for example, may be used.

When the sealing material 15 is put on the through hole 13 before the chamber 6 is evacuated, there are some cases where an opening area which is partially closed with the sealing material 15 is smaller than the opening area of the neck portion which forms the minimum opening. As to the conductance and capability of the evacuation of the chamber, the smaller opening area has to be considered, because the sizes of both opening areas depend on the shape (size, taper angle, and opening shape) of the through hole and the shape (size and three-dimensional shape) of the sealing material.

In the vacuum package according to this exemplary embodiment as shown in FIGS. 1-3, the sealing pad 14 is formed on the first taper surface 12b in the through hole 13 of the infrared transmission window 12 and on at least a part of the outer surface 12a extending from the first taper surface 12b continuously. The sealing pad 14 is not formed on the second taper surface 12c and on the inner surface 12d. As a material of the sealing pad 14, a material which has a higher wetting property to the sealing material 15 than the infrared transmission window 12 is used. Ni, NiP, Au, Cu, Ag, Fe, Co, Pd, Ti, Cr, Pt and an alloy including any material as above as a principal ingredient may be used as the sealing pad 14, for example. Therefore, the sealing material 15 can be reliably disposed into the through hole 13 so as to lie on the sealing pad 14, that is, on the first taper surface 12b even if the sealing material 15 becomes a fused state, and can seal the through hole 13 at the neck portion 13a which has the smallest opening area. On the other hand, the sealing material 15 does not project into the inside of the chamber 6 from the inner face 12d because the sealing material 15 does not seal the through hole 13 on the second taper surface 12b. Therefore, the sealing material 15 can seal the chamber airtightly and be prevented from contacting with the infrared receiving component 1 and bonding wires 5 in the chamber 6.

Next, details of the vacuum package 100 for the infrared sensor according to the first exemplary embodiment showing FIG. 1 will be explained below.

A first electrode pad 4 is formed on the light-receiving substrate 3. The first electrode pad 4 extends from the inside to the outside of the chamber 6 along the light-receiving component substrate 3. Each second electrode pad 16 of the infrared receiving component 1 is electrically connected with the first electrode pad 4 by a bonding wire 5. Therefore, a signal detected by the infrared receiving component 1 is transmitted to the outside of the chamber 6 via the first electrode pad 4.

The light-receiving component substrate 3 is formed of a material which can keep high vacuum in the chamber 6. As the material of the light-receiving component substrate 3, a semiconductor material such as Si and Ge, metal such as Ni, Fe, Co, Ti, Au, Ag, Cu, Al, Pd, Pt and an alloy material including any metal as above as a principal ingredient, or a glass or ceramic material such as $SiO_2$ and $Al_2O_3$ may be used, for example.

A first connecting pad 8a is formed on the first electrode pad 4 via an insulating layer 7 so as to surround the infrared receiving component 1. A spacer 9 is bonded on the first connecting pad 8a by a first bonding material 10a. The spacer 9 surrounds the infrared receiving component 1 and gives a predetermined gap to dispose the infrared receiving component 1 between the light-receiving component substrate 3 and the infrared transmission window 12. A second connecting pad 8b of the infrared transmission window 12 is bonded on the spacer 9 by a second bonding material 10b. The infrared receiving component 1 is covered with the infrared transmission window 12 so as to form the chamber 6. Each bonding between the elements is formed so as to enhance the airtightness (belmetic seal) of the chamber 6.

As the insulating layer 7, a ceramic or glass material such as $SiO_2$, SiON and SiN may be used, for example.

The material of the spacer 9 is not limited, but it is necessary not to release gas when the chamber 6 is evacuated. As the material of the spacer 9, a semiconductor material such as Si and Ge, metal such as Ni, Fe, Co, Cr, Ti, Au, Ag, Cu, Al, Pd, Pt and an alloy material including any metal as above as a principal ingredient, or a glass or ceramic material such as $SiO_2$ and $Al_2O_3$ may be used, for example.

As the bonding materials 10a and 10b, Au and solder or braze (collectively termed "solder" herein) may be used. If Au is used for the bonding, after Au is formed on the first connecting pad 8a of the light-receiving component substrate 3 and the second connecting pad 8b of the infrared transmission window 12, the bonding is performed by heat press bonding, ultrasonic bonding, surface active bonding and the like. On the other hand, the solder is used for the bonding, after Ni, NiP, Au, Cu, Ag, Fe, Co, Pd, Ti, Cr, Pt or an alloy including any material as above as a principal ingredient is formed on the spacer 9 and the first connecting pad 8a of the light-receiving component substrate 3 and the second connecting pad 8b of the infrared transmission window 12 in order to prevent the solder from diffusing or to promote the wetting property of the solder, the bonding is performed by providing the solder between the spacer 9 and the pads 8a and 8b and heat-fusing the solder by a reflow heater or hot plate. Alternatively, the bonding may be performed by forming the solder on the connecting pads 8a and 8b by plating, spattering or vapor deposition in advance. If the bonding materials 10a and 10b are the solder, it is preferred that a material including low fusion point metal such as Sn, Pb, SnPb, SnAg, SnCu, SnAgCu, SnIn, SnZn, SnBi, SnZnBi, Bi, In, InAg as a principal ingredient is used as the material of the solder. In addition, without the bonding materials 10a and 10b, substrate materials such as Si/Si, $SiO_2/SiO_2$, Si/glass may be directly bonded with each other by anode bonding.

Both surfaces of the infrared transmission window 12 have antireflection coatings 11a and 11b over the infrared receiving component 1. The infrared transmission window 12 is formed of a material which is allowed to transmit the infrared rays. As a material of the infrared transmission window 12, Si, Ge, ZnS, ZnSe, $Al_2O_3$, $SiO_2$, a material of alkali halide or alkaline-earth halide type such as LiF, NaCl, KBr, CsI, $CaF_2$, $BaF_2$, $MgF_2$, and glass of a chalcogenide type including Ge, As, Se, Te, Sb as a principal ingredient may be used, for example.

As the sealing material 15 to seal the through hole 13 of the infrared transmission window 12, a material including low fusion point metal such as Sn, Pb, SnPb, SnAg, SnCu, SnAgCu, SnIn, SnZn, SnBi, SnZnBi, Bi, In, InAg as a principal ingredient may be used, for example.

According to this exemplary embodiment, the defect such as the crack can be prevented from occurring in the time of bonding the sealing material 15 and using the product because the edge portions of the through hole 13 have the obtuse angle. Even if the substrate forming through hole 13 is silicon or glass which is apt to break, the occurrence of the crack in the through hole 13 is suppressed. The airtightness defect is also prevented by forming the sealing pad 14 at the bonding part of the sealing material 15. Therefore, the vacuum package having the highly airtight property can be obtained.

The sealing material 15 is prevented from projecting into the chamber 6 by retaining the sealing material 15 at the neck portion 13a and not forming the sealing pad 14 on the second taper surface 12c on the infrared receiving component 1 side. Therefore, the occurrence of the functional fault and short circuit can be prevented.

The through hole 13 can have the larger conductance to the opening area on the surface of the substrate as compared with a through hole having a one-way taper surface because the taper surfaces 12b and 12c are symmetrically formed from the both surfaces of the infrared transmission window 12. In other words, the through hole 13 having large conductance to effectively evacuate the chamber 6 can be formed without making the opening on the surface of the substrate at a larger size (or diameter). Therefore, with the performance level keeping, miniaturization of the vacuum package can be achieved.

Next, vacuum packages according second to seventh exemplary embodiments of the present invention will be explained. The second to seventh exemplary embodiments are different in modes of a through hole in a cross section across a thickness of the infrared transmission window. Formulations other than the through hole in the second to seventh exemplary embodiments are similar to the first exemplary embodiment.

Figure 7A:
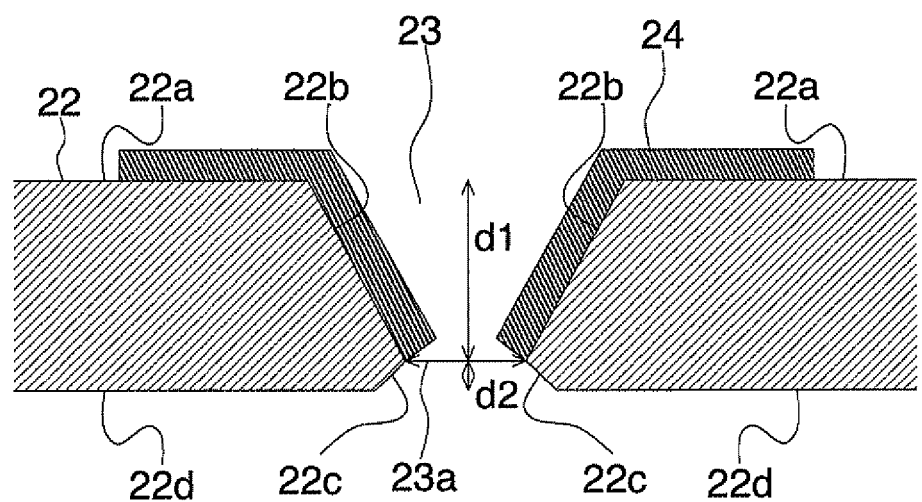
FIGS. 7A and 7B are schematically cross-sectional views of a through hole according to a second exemplary embodiment of the present invention.
Figure 7B:
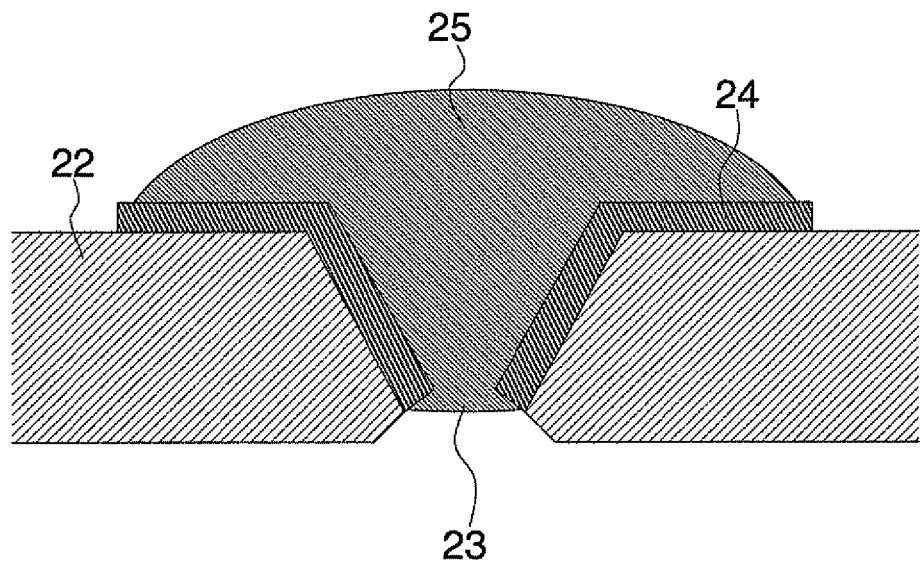

In FIGS. 7A and 7B, partial and schematically cross-sectional views of the through hole in the second exemplary embodiment of the present invention are illustrated. FIG. 7A is a schematically cross-sectional view of the through hole showing a state before sealing, and FIG. 7B is a schematically cross-sectional view of the through hole showing a state after sealing the through hole with a sealing material. Whereas, in the first exemplary embodiment shown in FIG. 2, the depth of the first taper surface from the outer side of the infrared transmission window is substantially same as the depth of the second taper surface from the inner surface, in the second exemplary embodiment, depth d1 of a first taper surface 22b from an outer surface 22a of the infrared transmission window 22 is deeper than depth d2 of a second taper surface 22c from an inner surface 22d. Therefore, a neck portion 23a of the through hole 23 is formed on the inner surface 22d side as compared with the outer surface 22a side, and the opening of the through hole 23 on the outer surface 22a is lager than the opening of the through hole 23 on the inner surface 22d. A sealing pad 24 is formed on the first taper surface 22b and outer surface 22a, and a sealing material 25 seals the through hole 23 so as to cover the sealing pad 24. According to this exemplary embodiment, the sealing material 25 is suitably put on the through hole 23 upon sealing.

Figure 8A:
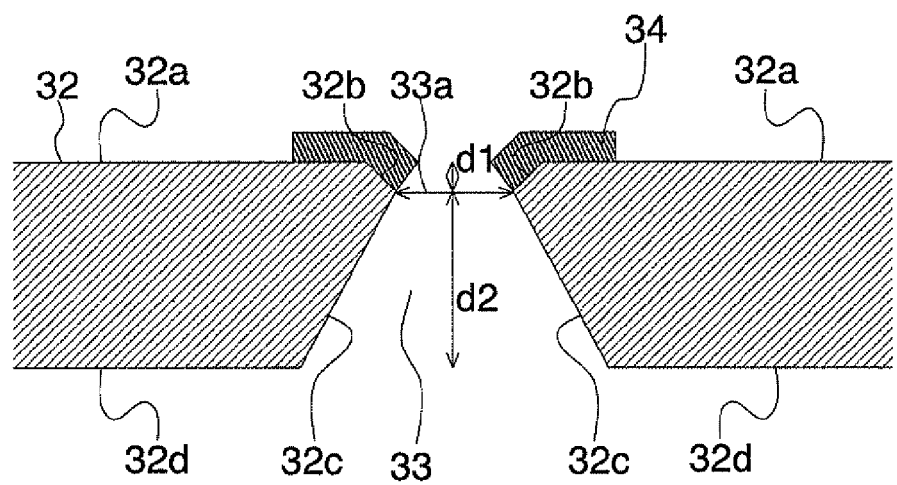
FIGS. 8A and 8B are schematically cross-sectional views of a through hole according to a third exemplary embodiment of the present invention.
Figure 8B:
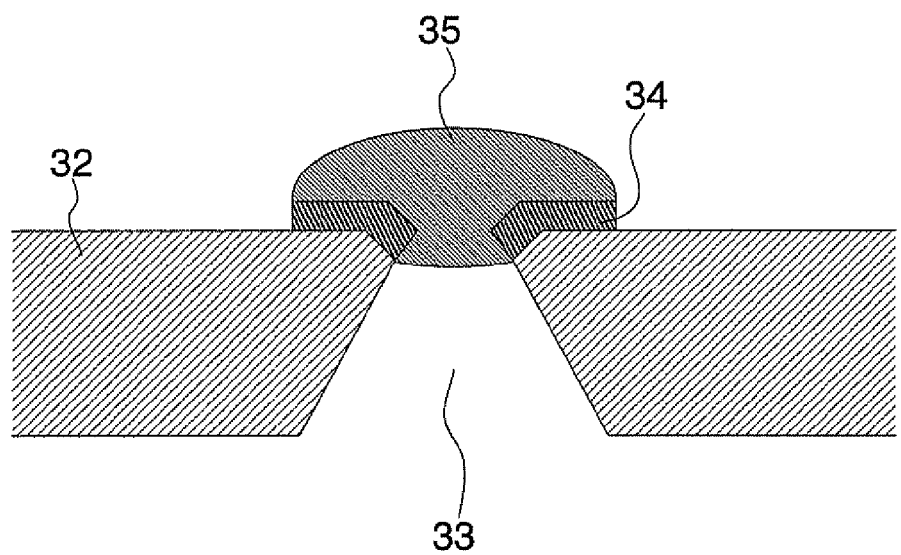

In FIGS. 8A and 8B, partial and schematically cross-sectional views of a through hole in the third exemplary embodiment of the present invention are illustrated. FIG. 8A is a schematically cross-sectional view of the through hole showing a state before sealing, and FIG. 8B is a schematically cross-sectional view of the through hole showing a state after sealing the through hole with a sealing material. Whereas, in the second exemplary embodiment, the first taper surface is deeper than the second taper surface, in the third exemplary embodiment, depth d2 of a second taper surface 32c from an inner surface 32d of an infrared transmission window 32 is deeper than depth d1 of a first taper surface 32b from an outer surface 32a. Therefore, a neck portion 33a of the through hole 33 is formed on the outer surface 32a side as compared with the inner surface 32d side, and an opening of the through hole 33 on the inner surface 32d is larger than an opening of the through hole 33 on the outer surface 32a. A sealing pad 34 is formed on the first taper surface 32b and outer surface 32a, and the sealing material 35 seals the through hole 33 so as to cover the sealing pad 34. According to this exemplary embodiment, even if the sealing material 35 (solder, for example) is easy to flow during heating, the sealing material 35 can be made to hardly project into a chamber.

Figure 9A:
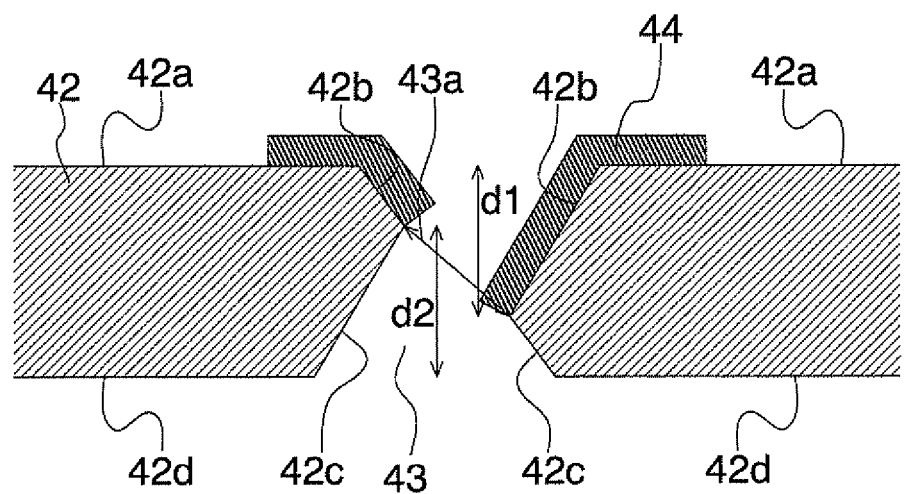
FIGS. 9A and 9B are schematically cross-sectional views of a through hole according to a fourth exemplary embodiment of the present invention.
Figure 9B:
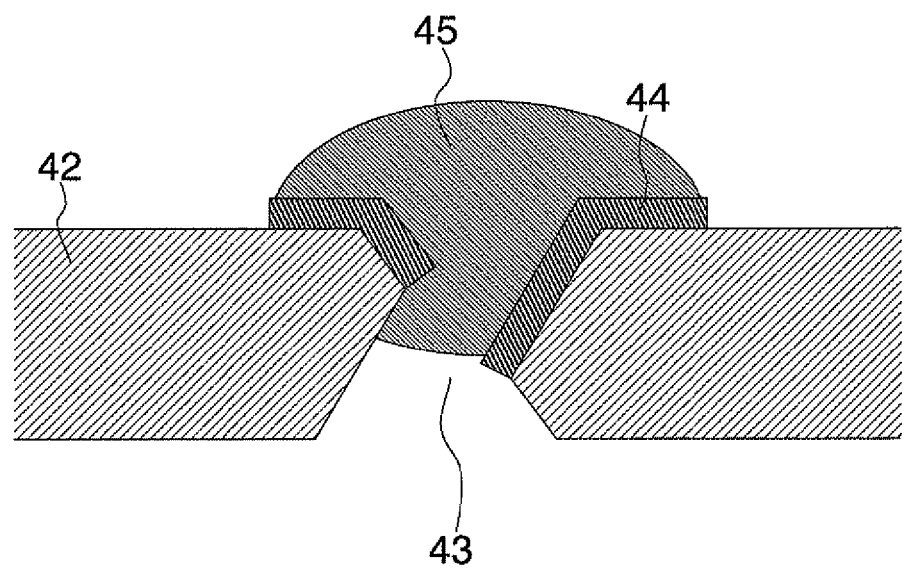

In FIGS. 9A and 9B, partial and schematically cross-sectional views of a through hole in the fourth exemplary embodiment of the present invention are illustrated. FIG. 9A is a schematically cross-sectional view of the through hole showing a state before sealing, and FIG. 9B is a schematically cross-sectional view of the through hole showing a state after sealing the through hole with a sealing material. Whereas, in the first to third exemplary embodiments, the center line of the through hole on the outer surface side forming the first taper surface registers with the center line of the through hole on the inner surface side forming the second taper surface, in the fourth exemplary embodiment, a center line of the through hole 43 on an outer surface 42a side forming a first taper surface 42b does not register with a center line of the through hole 43 on an inner surface 42d side forming a second taper surface 42c (see arrows d1 and d2). Therefore, a line linking to edge portions on an inner wall of the through hole 43 (a neck portion 43a) is not parallel to a direction extending along the surface of the infrared transmission window 42. In this exemplary embodiment, a sealing pad 44 is formed on the first taper surface 42b, and the sealing material 45 seals the through hole 43 on at least the sealing pad 44. According to this exemplary embodiment, the sealing material 45 is hard to flow down due to the gravity in the time of heating because the through hole 43 passes through the infrared transmission window 42 in an oblique direction to the surface of the infrared transmission window 42 as a whole.

Figure 10A:
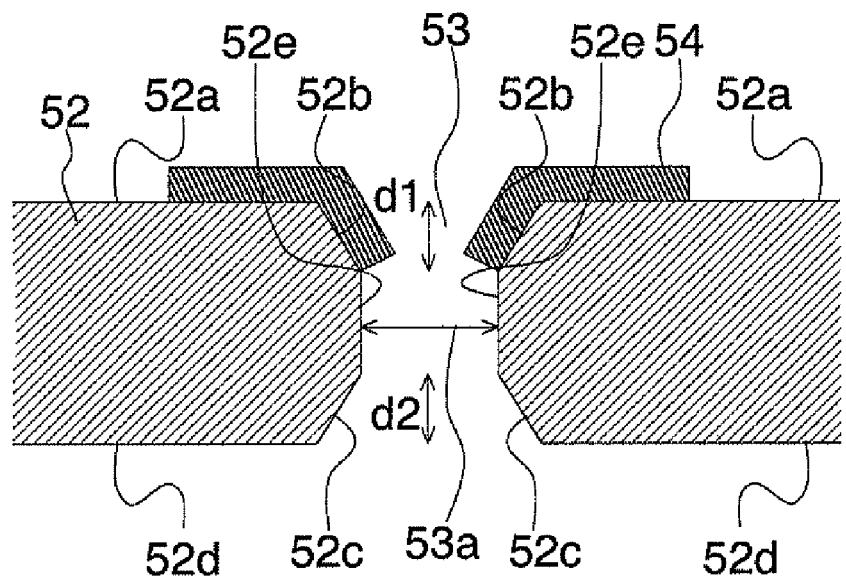
FIGS. 10A and 10B are schematically cross-sectional views of a through hole according to a fifth exemplary embodiment of the present invention.
Figure 10B:
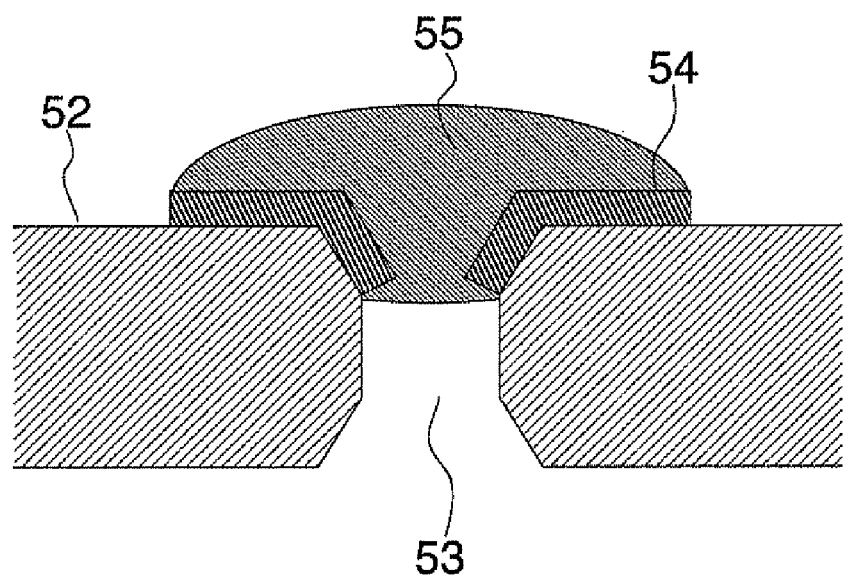

In FIGS. 10A and 10B, partial and schematically cross-sectional views of a through hole in the fifth exemplary embodiment of the present invention are illustrated. FIG. 10A is a schematically cross-sectional view of the through hole showing a state before sealing, and FIG. 10B is a schematically cross-sectional view of the through hole showing a state after sealing the through hole with a sealing material. Whereas, in the first to fourth exemplary embodiments, the first taper surface and the second taper surface are formed continuously, in the fifth exemplary embodiment, a first taper surface 52b does not continue from a second taper surface 52c, and an inner intermediate (e.g. cylindrical) surface 52e perpendicular to an infrared transmission window 52 is formed between the first and second taper surfaces. A sealing pad 54 is formed on the first taper surface 52b and outer surface 52a, and the sealing material 55 seals the through hole 53 so as to cover the sealing pad 54. The through hole 53 in this exemplary embodiment may be formed by further etching the through hole of the first exemplary embodiment.

Figure 11A:
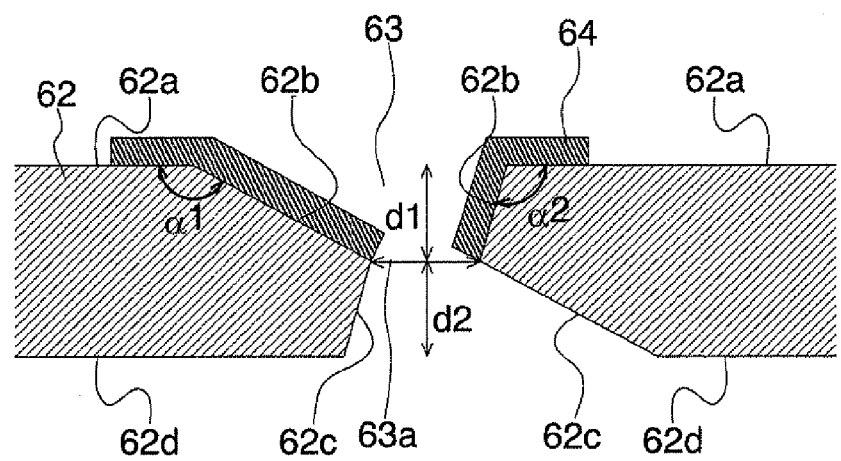
FIGS. 11A and 11B are schematically cross-sectional views of a through hole according to a sixth exemplary embodiment of the present invention.
Figure 11B:
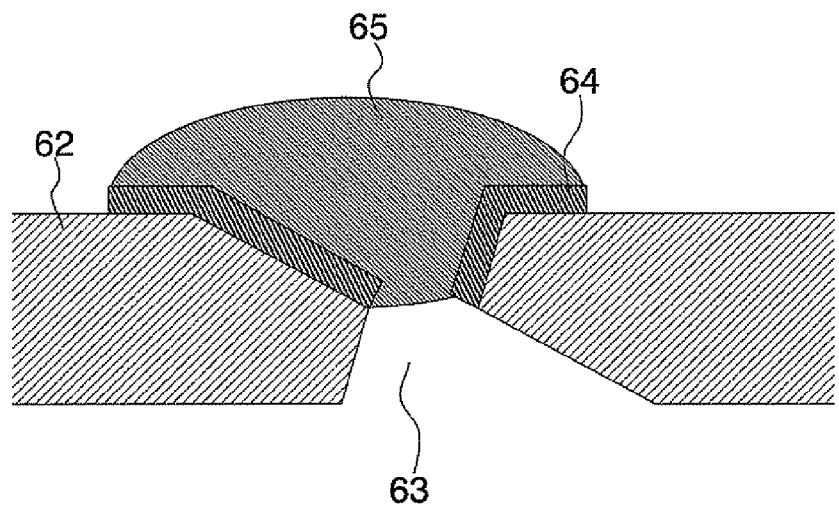

In FIGS. 11A and 11B, partial and schematically cross-sectional views of a through hole in the sixth exemplary embodiment of the present invention are illustrated. FIG. 11A is a schematically cross-sectional view of the through hole showing a state before sealing, and FIG. 11B is a schematically cross-sectional view of the through hole showing a state after sealing the through hole with a sealing material. In this exemplary embodiment, taper angles of a first taper surface 62b and second taper surface 62c are not unified. In the cross-sectional views of FIG. 11, for example, a left taper angle $\alpha 1$ of the first taper surface 62b is different from a right taper angle $\alpha 2$. This is similar to the second taper surface 62c. The through hole 63 may be formed by anisotropical etching where an outer surface 62a is made as a (411) surface.

Figure 12A:
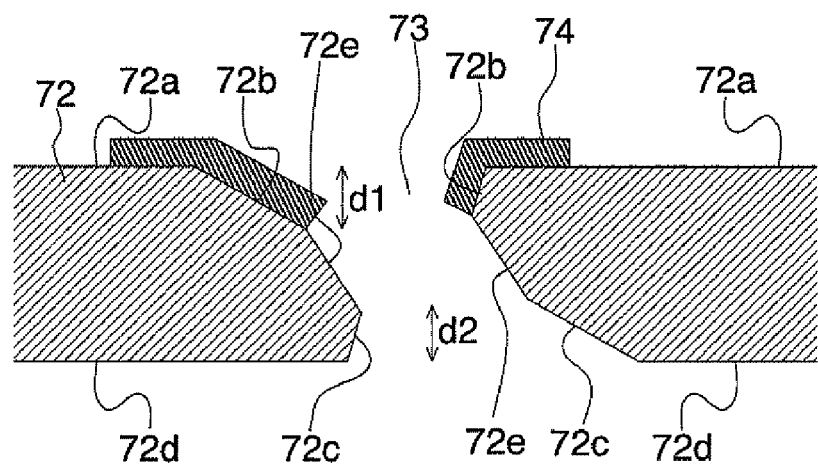
FIGS. 12A and 12B are schematically cross-sectional views of a through hole according to a seventh exemplary embodiment of the present invention.
Figure 12B:
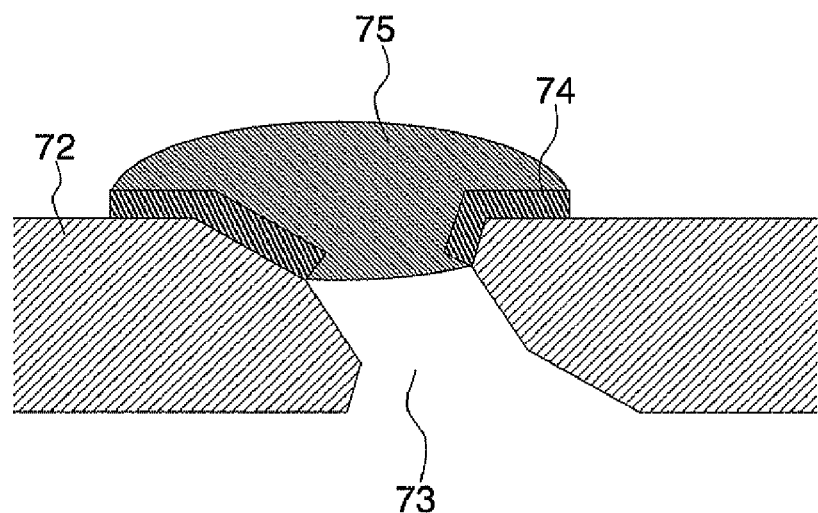

In FIGS. 12A and 12B, partial and schematically cross-sectional views of a through hole in the seventh exemplary embodiment of the present invention are illustrated. FIG. 12A is a schematically cross-sectional view of the through hole showing a state before sealing, and FIG. 12B is a schematically cross-sectional view of the through hole showing a state after sealing the through hole with a sealing material. In this exemplary embodiment, a first taper surface 72b does not continue from a second taper surface 72c, and an inner intermediate surface 72e is also formed between the first taper surface 72b and the second taper surface 72c by further etching the through hole of the sixth exemplary embodiment.

In the second to seventh exemplary embodiments, as explained in the first exemplary embodiment, the edge portions forming the through hole (the edge portions facing to the through hole) have an obtuse angle. The sealing pad is formed on the first taper surface and the outer surface and is not formed on the second taper surface and the inner (intermediate) surface.

The through holes in the first to seventh exemplary embodiments may be formed by the isotropical etching, dry etching, and a combination of the isotropical etching or dry etching and the anisotropical etching in addition to the anisotropical etching. The taper shapes described in the first to seventh exemplary embodiments are illustrated merely as examples, and the through hole is not limited to these exemplary embodiments and may have tapers of various shapes by using substrates having various surface directions and etching processes.

Next, vacuum packages according to eighth to eleventh exemplary embodiments will be explained. The eighth to eleventh exemplary embodiments are different from the first exemplary embodiment shown in FIG. 1 in a position forming a though hole or an mode of a chamber.

Figure 13:
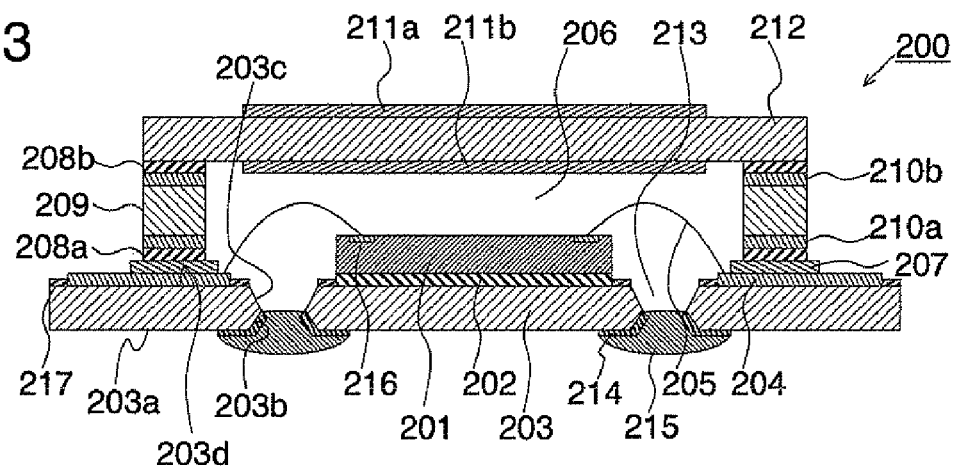
FIG. 13 is a schematically cross-sectional view of a vacuum package according to an eighth exemplary embodiment of the present invention.

The vacuum package according to the eighth exemplary embodiment of the present invention will be explained. In FIG. 13, a schematically cross-sectional view of the vacuum package according to the eighth exemplary embodiment of the present invention is illustrated. Whereas, in the first exemplary embodiment, the through hole is formed in the infrared transmission window, in the vacuum package 200 according to the eighth exemplary embodiment, a through hole 213 is formed in a light-receiving component substrate 203. Other than this formulation, the vacuum package 200 is similar to the vacuum package according to the first exemplary embodiment. The various formulations as explained in the first to seventh exemplary embodiments may be applied to the through hole 213.

Figure 14:
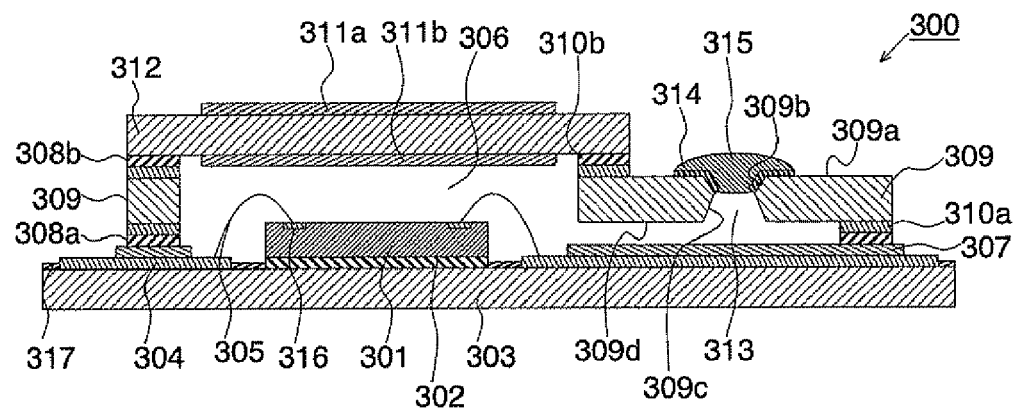
FIG. 14 is a schematically cross-sectional view of a vacuum package according to a ninth exemplary embodiment of the present invention.

The vacuum package according to the ninth exemplary embodiment of the present invention will be explained. In FIG. 14, a schematically cross-sectional view of the vacuum package according to the ninth exemplary embodiment of the present invention is illustrated. In a vacuum package 300 according to the ninth exemplary embodiment, a through hole 313 is formed in a spacer 309. At least a part of the spacer 309 has a wide part extending along a surface of an infrared transmission window 312 (or a light-receiving component substrate 303), the wide part being exposed to the outside of the infrared transmission window 312. The through hole 313 is formed in the wide part exposed to the outside of the infrared transmission window in a direction of a thickness of the infrared transmission window 312 (perpendicular to the extending surface). A first electrode pad 304 and insulating layer 307 are formed widely corresponding to the shape of the spacer 309. In the vacuum package 300, the other formulations are similar to the vacuum package according to the first exemplary embodiment. The various formulations as explained in the first to seventh exemplary embodiments may be applied to the through hole 313.

Figure 15:
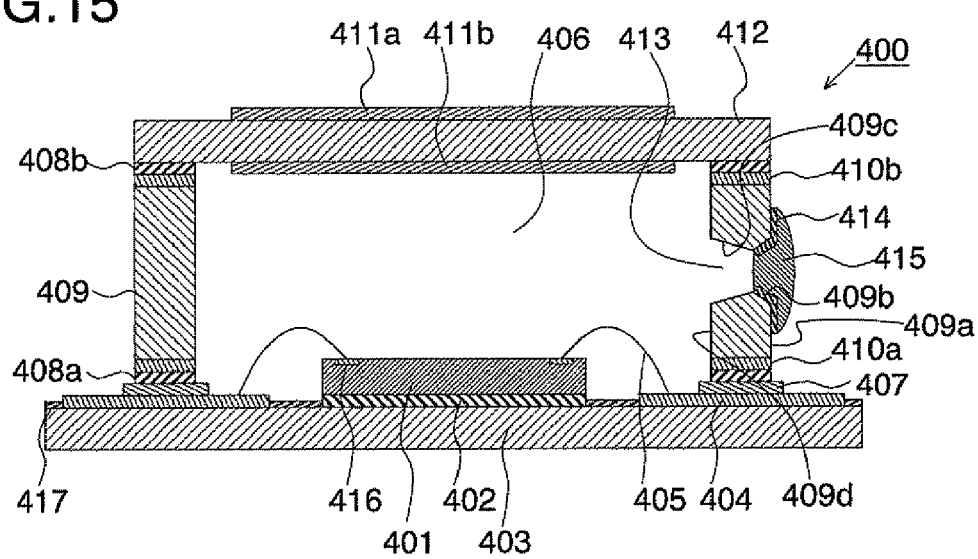
FIG. 15 is a schematically cross-sectional view of a vacuum package according to a tenth exemplary embodiment of the present invention.

The vacuum package according to the tenth exemplary embodiment of the present invention will be explained. In FIG. 15, a schematically cross-sectional view of the vacuum package according to the tenth exemplary embodiment of the present invention is illustrated. In a vacuum package 400 according to the tenth exemplary embodiment, a through hole 413 is formed in a spacer 409 like the ninth exemplary embodiment. In this exemplary embodiment, however, the spacer 409 extends so as to increase the space (height) of a chamber 406 (a distance between a light-receiving component substrate 403 and a infrared transmission window 412). The through hole 413 is formed from the side of the spacer 409 in a direction along the surface of the infrared transmission window 412 (perpendicular to the direction along the thickness). The other formulations are similar to the vacuum package according to the first exemplary embodiment. The various formulations as explained in the first to seventh exemplary embodiments may be applied to the through hole 413.

Figure 16:
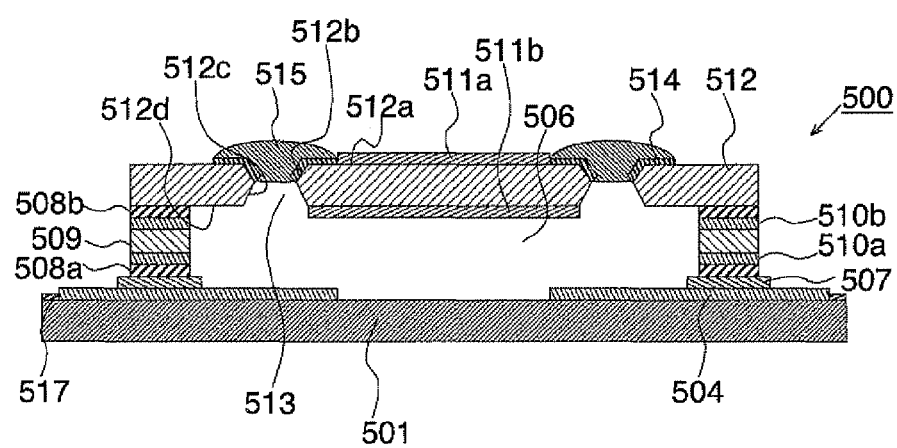
FIG. 16 is a schematically cross-sectional view of a vacuum package according to an eleventh exemplary embodiment of the present invention.

The vacuum package according to the eleventh exemplary embodiment of the present invention will be explained. In FIG. 16, a schematically cross-sectional view of the vacuum package according to the eleventh exemplary embodiments of the present invention is illustrated. Whereas, in the first and eighth to tenth exemplary embodiments, the infrared receiving component is connected on the light-receiving component substrate via the bonding material, and the light-receiving component substrate is formed as a part of the chamber, in the vacuum package 500 according to the eleventh exemplary embodiment, an infrared receiving component 501 itself is formed as a part of a chamber 506 without a light-receiving component substrate. Accordingly, an electrode pad 504 and insulating layer 507 are formed on the infrared receiving component 501. Whereas, in FIG. 16, the through hole 513 is formed in the infrared transmission window 512, the through hole 513 may be formed in a spacer 509. The other formulations are similar to the vacuum package according to the first exemplary embodiment. The various formulations as explained in the first to seventh exemplary embodiments may be applied to the through hole 513. According to this exemplary embodiment, as compared with the first exemplary embodiment, electrical connection such as wire bonding is unnecessary, and further the vacuum package can be made thinner.

The first exemplary embodiment and eighth to eleventh exemplary embodiments may be combined. In other words, in each exemplary embodiment, although the through hole is formed in the infrared transmission window, the spacer or the light-receiving component substrate, a plurality of the through holes may be formed in any combination selected from the infrared transmission window, the spacer and the light-receiving component substrate.

Figure 17:
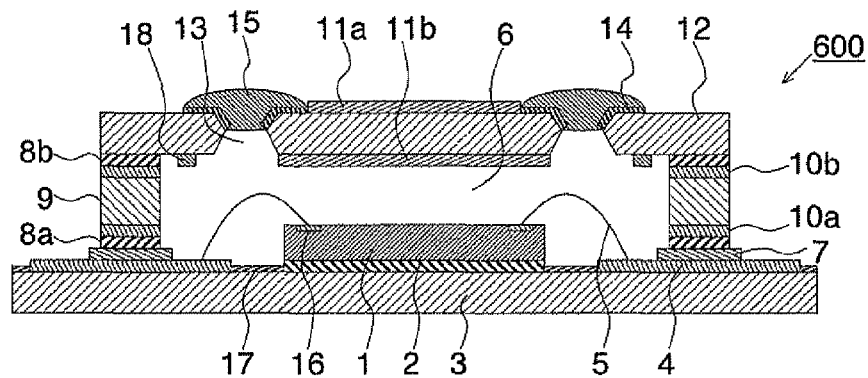
FIG. 17 is a schematically cross-sectional view of a vacuum package according to a twelfth exemplary embodiment of the present invention.
Figure 18:
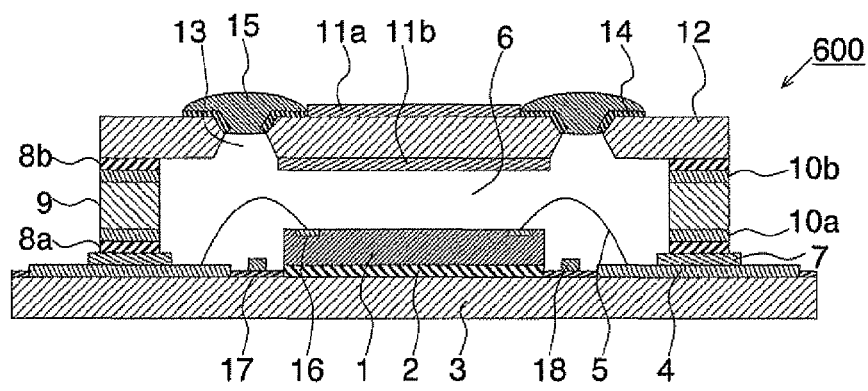
FIG. 18 is a schematically cross-sectional view of a vacuum package according to a twelfth exemplary embodiment of the present invention.

Next, the vacuum package according to the twelfth exemplary embodiment of the present invention will be explained. In FIGS. 17-19, schematically cross-sectional views of the vacuum package according to the twelfth exemplary embodiment of the present invention are illustrated. Although a vacuum package 600 shown in FIGS. 17-19 is similar to the vacuum package according to the first exemplary embodiment, a different point is that the chamber 6 has a getter 18 to achieve high evacuation (or vacuum) in the chamber 6. The getter 18 is provided on the infrared transmission window 12 in the formulation shown in FIG. 17, on the light-receiving component substrate 3 (insulating layer 17) in the formulation shown in FIG. 18, and on the spacer 9 in the formulation shown in FIG. 19. The formulations shown in FIGS. 17-19 may be combined as the positions of the getters 18. The getter 18 may be formed of a material of a Zr type, a material of a Ti type or an alloy including such a material, and be activated to highly evacuate the chamber 6 after the package is airtight-sealed. Although the vacuum package 600 according to the twelfth exemplary embodiment is explained based on the vacuum package according to the first exemplary embodiment, the vacuum package 600 according to the twelfth exemplary embodiment may be applied to the vacuum packages according to the second to eleventh exemplary embodiments.

Next, a process of forming a through hole in the vacuum package of the present invention will be explained as a thirteenth exemplary embodiment. In FIGS. 20A-20E, giving an example of the vacuum package according to the first exemplary embodiment, a schematic process flow is illustrated to explain a process of forming the vacuum package in the infrared transmission window. Antireflection coatings 11a and 11b are formed at predetermined positions in the infrared transmission window 12 (FIG. 20A). Next, a mask or antialkali resist 19, such as $SiO_2$, SiN, SiON, metal and the like, is formed on a part where the through hole is not formed (FIG. 20B). Next, anisotropic etching using KOH, TMAH (tetramethylammonium hydroxide), hydrazine, EPW (ethylene-diamine-pyrocatechol-water) or the like is treated to both surfaces 12a and 12b to form the through holes 13 having the first taper surface 12b and second taper surface 12c (FIG. 20C). Isotropic etching may be used to form the through hole 13. Next, the sealing pads 14 for the sealing material connection are formed on the first taper surface 12b and a part of the outer surface 12a continuing from the first taper surface 12b by sputtering, vapor deposition, plating or the like (FIG. 20D). Finally, the second connecting pad 8b to connected to the spacer is formed by sputtering, vapor deposition, plating or the like (FIG. 20E).

Although this is explained based on the first exemplary embodiment, the through holes even in the second to seventh exemplary embodiments may be formed in the similar way to the forming process shown in FIG. 20 by suitably changing the etching condition such as depth and direction of the etching. Even in the eighth to eleventh exemplary embodiments in which the through hole is formed in the light-receiving component substrate or spacer, the through hole may be formed in the similar way to the forming process shown in FIG. 20. If the substrate in which the through hole is formed is not silicon but metal, the through hole may be formed by using a photoresist as the mask material and using acid or alkali as the etching liquid.

Figure 21:
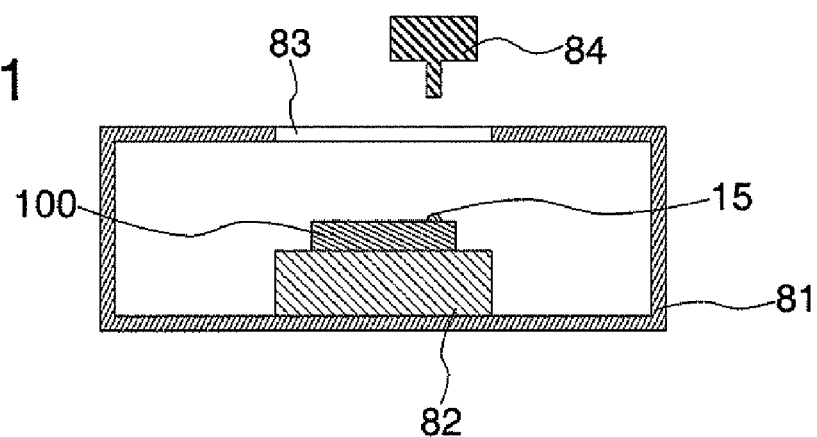
FIG. 21 is a schematically cross-sectional view according to a fourteenth exemplary embodiment of the present invention to explain a process of vacuum-sealing a vacuum package.
Figure 22:
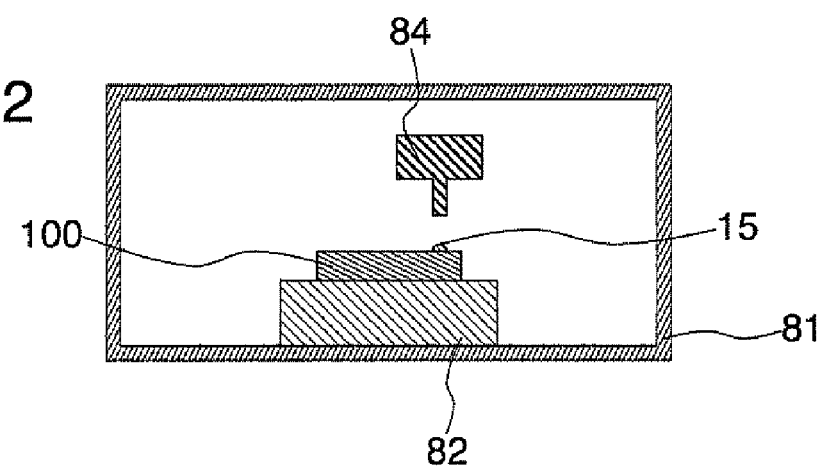
FIG. 22 is a schematically cross-sectional view according to a fifteenth exemplary embodiment of the present invention to explain a process of vacuum-sealing a vacuum package.

Next, a process of vacuum-sealing the vacuum package of the present invention will be explained as fourteenth to fifteenth exemplary embodiments. In FIG. 21, a schematically cross-sectional view is illustrated to explain the vacuum-sealing process according to the fourteenth exemplary embodiment. In FIG. 22, a schematically cross-sectional view is illustrated to explain the vacuum-sealing process according to the fifteenth exemplary embodiment. An example of the vacuum package according to the first exemplary embodiment is given as the vacuum package to be vacuum-sealed.

In the fourteenth exemplary embodiment, the package 100 in which the through hole is formed is set on a stage 82 in a vacuum chamber 81. Next, the vacuum chamber 81 is highly evacuated to evacuate the chamber of the vacuum package 100. In case of the infrared sensor, for example, it is preferred that the degree of the vacuum is $10^{-2}$ Torr or less in order to achieve a minimum performance. It is preferred that the degree of the vacuum is enhanced further in order to maintain the stability of the device for a long term. Next, with this state keeping, the sealing material (solder, for example) 15 is put on the through hole of the vacuum package 100. Alternatively, as explained in the first exemplary embodiment, the sealing material 15 may be put on the through hole in the atmosphere before the vacuum chamber 81 is evacuated. Next, a laser is radiated from the outside of the vacuum chamber 81 to the sealing material 15 through a transmission window 83 of the vacuum chamber 81 by a laser device 84. This fuses the sealing material 15 to seal the through hole.

Whereas, in the fourteenth exemplary embodiment shown in FIG. 21, the laser device 84 is provided out of the vacuum chamber 81, in the fifteenth exemplary embodiment shown in FIG. 22, the laser device 84 is provided in the vacuum chamber 81. In this case, the transmission window may be omitted because the sealing material is heated directly. The other formulations are similar to ones of the fourteenth exemplary embodiment.

According to the processes shown in FIGS. 21 and 22, even if the bonding material such as solder is used for the connection between the light-receiving component substrate and the spacer and between the spacer and the infrared transmission window, because only the sealing material placed on the through hole 15 can be locally heated by the laser device 84, not only when the fusion point of the sealing material 15 for the through hole is the fusion point of the bonding material or lower, only the sealing material of the through hole can be fused for the vacuum sealing without fusing the bonding material, but also when the fusion point of the sealing material 15 is higher than the fusion point of the bonding material, only the sealing material 15 of the through hole can be fused for the sealing if the condition is optimized. Although a YAG laser is suitable for the laser device 84, any laser which is capable of heating the solder, such as a ruby laser, carbon dioxide laser, excimer laser, liquid laser, semiconductor laser, and free-electron laser, may be further used.

Figure 23:
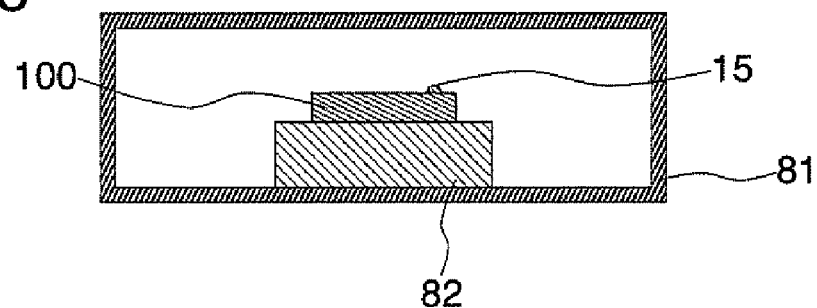
FIG. 23 is a schematically cross-sectional view according to a sixteenth exemplary embodiment of the present invention to explain a process of vacuum-sealing a vacuum package.
Figure 24:
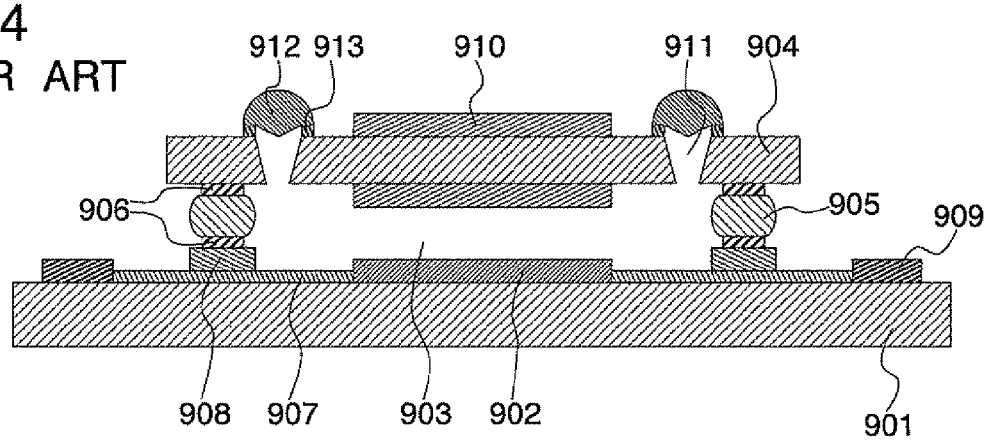
FIG. 24 is a schematically cross-sectional view to explain a vacuum package for infrared detection disclosed in Patent Document 1.
Figure 25:
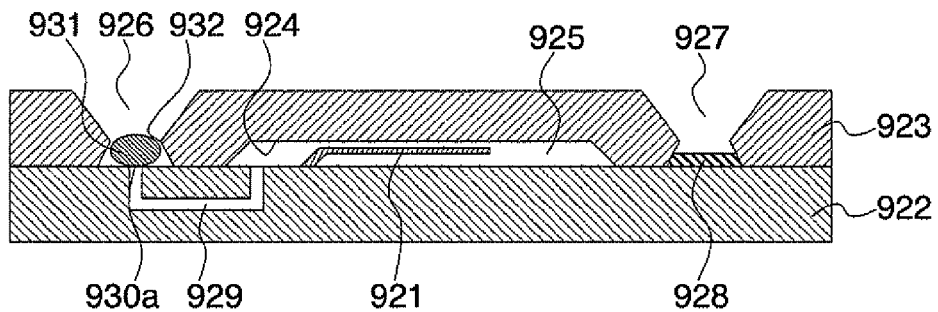
FIG. 25 is a schematically cross-sectional view to explain a sealing package design for a component disclosed in Patent Document 3.
Figure 26:
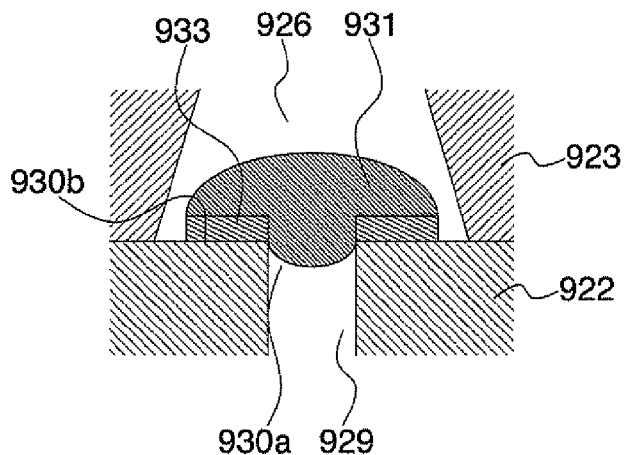
FIG. 26 is a partially and schematically cross-sectional view of a hole portion shown in FIG. 25.

Next, a process of vacuum-sealing the vacuum package of the present invention will be explained as a sixteenth exemplary embodiment. In FIG. 23, a schematically cross-sectional view is illustrated to explain the vacuum-sealing process according to the sixteenth exemplary embodiment. Whereas, in the fourteenth and fifteenth exemplary embodiments, the laser is used to fuse the sealing material, in the sixteenth exemplary embodiment, the whole package is heated to fuse the sealing material. A stage 82 may be heated to fuse the sealing material 15 after the vacuum chamber 81 is evacuated like the fourteenth and fifteenth exemplary embodiments, for example. If the bonding material such as the solder is used for the connection between the light-receiving component substrate and the spacer and between the spacer and the infrared transmission window, it is preferred that the fusion point of the sealing material 15 put on the through hole is lower than the fusion point of the bonding material in order not to fuse the bonding material.

Although the vacuum package according to the first exemplary embodiment is shown in FIGS. 21-23, the fourteenth to sixteenth exemplary embodiments may be applied to the vacuum packages according to the second to twelfth exemplary embodiments.

EXAMPLE 1

An example of the vacuum package of the present invention will be explained. A manufactured vacuum package was the vacuum package for the infrared sensor as shown in FIG. 1 and had an infrared receiving component as the functional component. The through hole was formed in the infrared transmission window like the first exemplary embodiment.

A silicon substrate for the infrared transmission window having the antireflection coatings, the sides of, e.g. 16.2 mm×16.2 mm and a thickness of, e.g. 0.8 mm was prepared, and the anisotropic etching was treated with e.g. KOH from both surfaces of the silicon substrate to form the through holes. As shown in FIG. 2 according to the first exemplary embodiment, the formed through holes had the first and second taper surfaces with the same depth to form the neck part at the middle of the through hole and the symmetry to the center line of the through hole. The opening shape of the through hole on the substrate surface was a square 0.726 mm on a side having the area of 0.527 mm². The angles of the edge portions forming the through hole were $\alpha=125.3°$, $\beta=109.4°$ and $\gamma=125.3°$ if $\alpha$, $\beta$ and $\gamma$ shown in FIG. 2 were used for the expression. In other words, all edge portions forming the through hole had the obtuse angle. The neck portion which was the minimum opening part of the through hole had sides of 0.16 mm and the area of 0.0256 mm².

Next, a Ti/Al coating was formed on the outer surface of the infrared transmission window (the opposite side to the chamber) and the first taper surface of the through hole continuing from the outer surface by the sputtering. Ti had a thickness of 0.1 µm and Al had a thickness of 1 µm. Ti/Al was also formed at the inner surface side (chamber side) of the infrared transmission window as the connecting pad to connect with the spacer. The Ti/Al pad surrounded the infrared receiving component and had a width of about 1 mm. Then NiP having a thickness of 3 µm and Au having a thickness of 0.05 µm were formed on Ti/Al by the electroless plating. Then the silicon substrate was diced to separate pieces.

Next, another silicon substrate having a thickness of 1 mm was etched from both surfaces to form the spacer having a though hole of 13.8 mm×13.8 mm at the center to surround the infrared receiving component. Then Ti/Al electrode pads having a width of 1 mm were formed on both surfaces of the spacer so as to surround the infrared receiving component. Then NiP having a thickness of 3 µm and Au having a thickness of 0.05 µm were formed on the spacer by the electroless plating. Then the silicon substrate was diced to separate pieces of 16.2 mm×16.2 mm.

Next, at a first layer, a wiring to connect the inside of the chamber with the outside as the electrode pad and, at a second layer, a connecting pad having a width of 1 mm to connect with the spacer were formed in the silicon substrate of 18 mm×18 mm×0.625 mm as the light-receiving component substrate. A $SiO_2$ insulating layer was formed between the wiring at the first layer and the pad at the second layer. The wiring pad had Ti having a thickness of 0.1 µm and Al having a thickness of 1 µm. NiP having a thickness of 3 µm and Au having a thickness of 0.4 µm were formed on the wiring pad by the electroless plating. The infrared receiving component was fixed on the light-receiving component substrate by the bonding material, and each second electrode pad of the infrared receiving component was electrically connected to the first electrode pad formed on the light-receiving component substrate by an Al wire of φ30 μm.

Next, lead-free solder preformed materials of SnAgCu having an outer perimeter of 16 mm×16 mm, a thickness of 200 μm, a width of 1 mm, and the through hole of an inner perimeter of 14 mm×14 mm were sandwiched between the infrared transmission window and the spacer and between the spacer and the light-receiving component substrate as the bonding material to connect the spacer with the infrared transmission window and the light-receiving component substrate. These components were passed through a reflow as a whole to fuse the solder pre-formed material and to connect these components.

Next, after the solder balls of SnAgCu having φ0.6 mm as the sealing material were put on the through holes of the infrared transmission window, the formed components were kept in a vacuum chamber of $10^{-6}$ Torr. A Nd-YAG laser having a wavelength of 1.06 μm (or may be a second harmonic having a wavelength of 0.53 μm) was radiated to the solder balls through a glass window formed in the vacuum chamber, and then the solder balls were heated to be fused to seal the through holes. The vacuum package was manufactured by the above process.

The molecule flow conductance in the through hole according to this example was calculated. In this example, the conductance was calculated based on the opening area of the neck portion because the opening area (0.515 mm$^2$) at the part closed with the solder ball is larger than the opening area (0.0256 mm$^2$) at the neck portion which becomes the minimum opening. The minimum opening area of the through hole in this example (at the neck portion), which is 0.0256 mm$^2$, corresponds to a through hole of a column shape having a diameter of 0.18 mm. So, if conductance Cp of the viscous flow region in the through hole having D=0.18 mm and L=0.8 mm was calculated from the above formula 1, the value resulted in 239×p (mm$^3$/s), and conductance Ck of the molecule flow region resulted in 882 (mm$^3$/s) from the above formula 2. It was found that the evacuation can be achieved for a short time according to the present invention even if the conductance is considered because the volume of the cavity in the vacuum package was equal to 274 mm$^3$=14 mm×14 mm×1.4 mm.

[Comparison 1]

The through hole having only the one-way taper surface as shown in FIGS. 27A-29 was formed by anisotropically etching the infrared transmission window having a chip thickness of 0.8 mm as same as example 1 from only one surface. The planer shape of the through hole was a square as same as example 1, and the minimum opening area (opening area on one surface) of the through hole was 0.0256 mm$^2$, 0.16 mm each side. In other words, the minimum opening area of the through hole was made same as the minimum opening area of the through hole according to example 1. An angle of one edge portion forming the through hole (the angle δ shown in FIGS. 27A-29) becomes 54.7°. As a result, in comparison 1, the opening of the maximum opening area had a side of 1.293 mm and an opening area of 1.672 mm$^2$ if the through hole having the minimum opening area as same as in example 1 was formed.

[Comparison 2]

To form a through hole having the maximum opening area as same as the through hole according to example 1 was attempted like comparison 1, but it is impossible to form the through hole physically with the similar thickness of the chip (0.8 mm) and taper angle (54.7°).

Table 1 which compares the through hole according to example 1 with the through holes according to comparisons 1 and 2 will be shown below.

TABLE 1

| | Chip Thickness (mm) | Minimum Opening Area (mm$^2$) | Maximum Opening Area (mm$^2$) | Minimum Angle of Edge Portion (°) |
|---|---|---|---|---|
| Example 1 | 0.8 | 0.0256 | 0.527 | 109.5 |
| Comparison 1 | 0.8 | 0.0256 | 1.672 | 54.7 |
| Comparison 2 | 0.8 | Impossible | 0.527 | 54.7 |

In example 1 and comparison 1, the through holes having the same minimum opening area were formed so as to have the same conductance. As a result, according to the present invention, the opening area (maximum opening area) formed on the surface of the substrate (infrared transmission window) can be made smaller than one third of the maximum opening area according to comparison 1. In other words, according to the through hole of the present invention, the vacuum package can be downsized further.

Whereas, in the present invention, the second edge portion facing to the through hole had the angle of 109.5°, in comparison 1, the edge portion facing to the through hole had the angle of 54.7°. In the edge portion having the acute angle like this, cracks are apt to occur as compared with the edge portion having the obtuse angle of the present invention, and therefore there is possibility of lowering of the airtight property of the vacuum package. According to the present invention, however, the occurrence of the crack in the through hole can be suppressed.

Figure 27A:
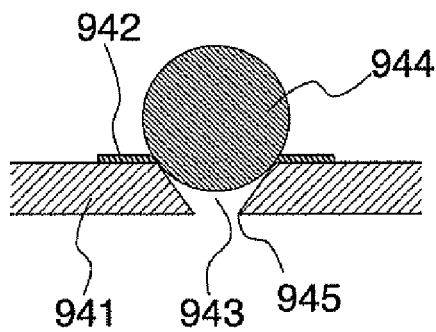
FIGS. 27A and 27B are schematically cross-sectional views of a through hole to explain a problem to be solved by the present invention.
Figure 27B:
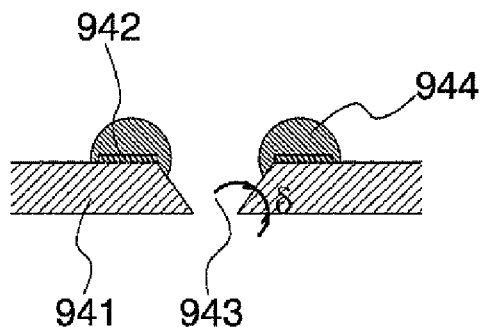
Figure 29:
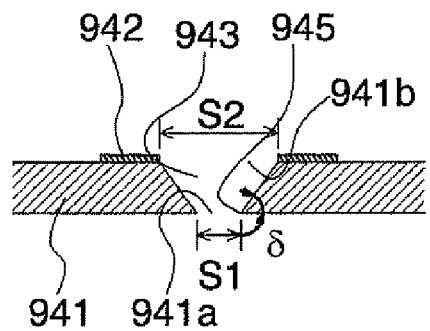
FIG. 29 is a schematically cross-sectional view of a through hole to explain a problem to be solved by the present invention.
Figure 30:
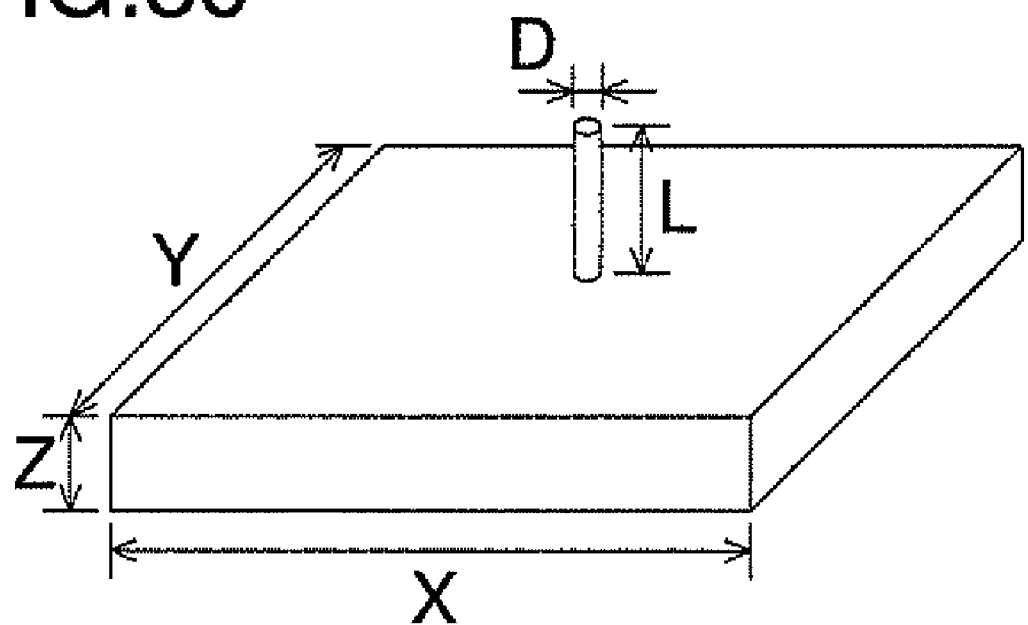
FIG. 30 is a perspective view to explain a method of calculating conductance of a through hole.

In comparison 1, if the sealing pad is formed only on the substrate surface as shown in FIGS. 27A, 27B and 29 and not formed on the inner wall of the through hole, the solder has to close the part having the maximum opening area of 1.672 mm$^2$, and therefore there is possibility of a leak arising from the imperfect sealing. According to the present invention, however, the part having the minimum opening area of 0.0256 mm$^2$, which corresponds to about 1.5% of the maximum opening area of comparison 1, is to be closed, and therefore a risk of the imperfect sealing can be reduced greatly.

Figure 28A:
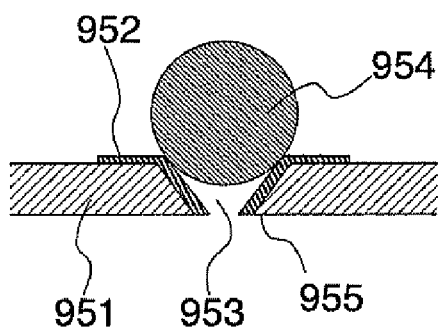
FIGS. 28A and 28B are schematically cross-sectional views of a through hole to explain a problem to be solved by the present invention.
Figure 28B:
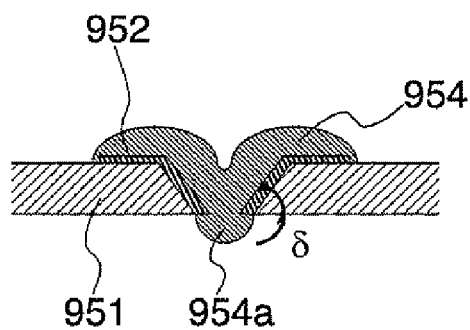

On the other hand, in comparison 1, as shown in FIG. 28, if the sealing pad is formed on the whole inner wall of the through hole, the minimum opening area to be sealed in example 1 is same as in comparison 1. In comparison 1, however, there is possibility that the solder projects into the chamber or that a whisker enters the chamber because the solder spreads over the whole through hole, and the part having the minimum opening area of the through hole is formed on the inner surface facing to the chamber. According to the present invention, however, the risk that the solder or whisker enters the chamber can be reduced greatly, because the sealing pad is formed on only the first taper surface, and the neck part having the minimum opening area is located apart from the inner surface facing to the chamber by 0.4 mm.

In this description, although "Torr" is often used as a unit of pressure for convenience, "Torr" may be converted into the SI unit based on 1 Torr=133.3 Pa.

Although the prevent invention is explained based on the above exemplary, the present invention is not limited to the above exemplary embodiments and examples, and may include any modification, change and improvement to the exemplary embodiments within the scope of the present invention. Within the scope of the present invention, various combinations, displacements and selections of disclosed elements are available.

A further problem, object and exemplary of the present invention become clear from the entire disclosure of the present invention including claims.

Although the vacuum package of the infrared sensor in which the infrared receiving component is used as the functional component is explained in the above exemplary, the functional component in the present invention is not limited to the infrared receiving component, and various functional components, such as the piezoelectric component and the oscillating component, which need the vacuum sealing may be applied to the present invention. In other words, it is understood that the vacuum package of the present invention may be applied to the pressure sensor and the acceleration sensor in addition to the infrared sensor.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A vacuum package comprising:
   a chamber in which pressure is reduced to less than the atmospheric pressure;
   a functional component sealed in said chamber said functional component is an infrared receiving component;
   a material forming at least a part of said chamber; wherein said material has at least one through hole to evacuate said chamber;
   in a cross section perpendicular to said material taken along said through hole, an edge portion of said material forming said through hole has an obtuse angle;
   said through hole is sealed with a sealing material; and
   a pad formed only on a part of the through hole.

2. The vacuum package according to claim 1, wherein an inner wall of said through hole has a first taper surface which reduces an opening area of said through hole in a direction from an outer surface side toward an inner surface side of said chamber and a second taper surface which reduces the opening area of said through hole in a direction from the inner surface side toward the outer surface side of said chamber; and
   said first taper surface is formed on the outer surface side as compared with said second taper surface.

3. The vacuum package according to claim 2, wherein the pad is formed on only said first taper surface in the inner wall of the through hole, said pad having a higher wetting property to said sealing material than said material.

4. The vacuum package according to claim 2, wherein said first taper surface and said second taper surface are formed continuously.

5. The vacuum package according to claim 1, wherein said sealing material does not project from said through hole into said chamber.

6. The vacuum package according to claim 1, wherein said chamber comprises, at least, a light-receiving component substrate on which said infrared receiving component is mounted, an infrared transmission window transmitting infrared rays so that said infrared receiving component receives the infrared rays from the outside of said chamber, and a spacer forming a predetermined gap between said light-receiving component substrate and said infrared transmission window; and
   said material forming said through hole makes up at least one of said light-receiving component substrate, said infrared transmission window and said spacer.

7. A process of manufacturing a vacuum package in which a functional component, said functional component is an infrared receiving component, is sealed in a chamber, pressure in said chamber being reduced to less than the atmospheric pressure, the process comprising:
   a through hole forming step of forming a through hole to evacuate said chamber in a material forming at least a part of said chamber, an inner wall of said through hole having at least a tubular first taper surface and a tubular second taper surface, said first taper surface being formed from one surface of said material so as to reduce an opening area, said second taper surface being formed from the other surface of said material so as to reduce an opening area;
   an evacuating step of evacuating said chamber accommodating said functional component through said through hole;
   a sealing step of sealing said through hole with a sealing material; and
   a forming step of forming a pad only on a part of the through hole, wherein
   in said through hole forming step, said through hole is formed so that an edge portion of said material forming said through hole has an obtuse angle in a cross section perpendicular to said material taken along said through hole.

8. The process according to claim 7, wherein
   the forming step of forming the pad further comprising forming the pad on said first taper surface located on the outer side of said chamber as compared with said second taper surface, said pad having a higher wetting property to said sealing material than said material; wherein
   said sealing material placed on said pad of said first taper surface or on the opening of said through hole formed on said one surface of said material is fused to seal said through hole.

9. The process according to claim 8, wherein
   in said evacuating step, before said chamber is evacuated, said sealing material is placed on said pad of said first taper surface or on said opening of said through hole formed on said one surface of said material;
   said chamber is evacuated through a gap between said sealing material and said through hole; and
   after evacuating said chamber, said sealing material is fused to seal said through hole.

10. The process according to claim 8, wherein
    in said sealing step, after said chamber is evacuated, said sealing material is placed on said pad of said first taper surface or on said opening of said through hole formed on said one surface of said material; and
    said sealing material is fused to seal said through hole.

* * * * *